(12) United States Patent
Kawabata

(10) Patent No.: US 9,881,877 B2
(45) Date of Patent: Jan. 30, 2018

(54) ELECTRONIC CIRCUIT PACKAGE USING COMPOSITE MAGNETIC SEALING MATERIAL

(71) Applicant: TDK Corporation, Tokyo (JP)

(72) Inventor: Kenichi Kawabata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/352,872

(22) Filed: Nov. 16, 2016

(65) Prior Publication Data

US 2017/0287848 A1 Oct. 5, 2017

Related U.S. Application Data

(60) Provisional application No. 62/315,828, filed on Mar. 31, 2016.

(30) Foreign Application Priority Data

Nov. 11, 2016 (JP) .................. 2016-220594

(51) Int. Cl.
| | |
|---|---|
| H01L 23/34 | (2006.01) |
| H01L 23/552 | (2006.01) |
| H01L 23/00 | (2006.01) |
| H01L 23/498 | (2006.01) |
| H01L 23/29 | (2006.01) |
| H01L 23/31 | (2006.01) |
| B29C 33/00 | (2006.01) |
| B29L 31/00 | (2006.01) |

(52) U.S. Cl.
CPC ........ *H01L 23/552* (2013.01); *B29C 33/0038* (2013.01); *H01L 23/295* (2013.01); *H01L 23/3114* (2013.01); *H01L 23/49822* (2013.01); *H01L 24/16* (2013.01); *B29K 2995/0008* (2013.01); *B29L 2031/712* (2013.01); *H01L 2224/16104* (2013.01)

(58) Field of Classification Search
CPC ........................... H01L 23/295; H01L 21/563
See application file for complete search history.

(56) References Cited

U.S. PATENT DOCUMENTS

2009/0321923 A1* 12/2009 Swaminathan ....... H01L 21/563
257/712

FOREIGN PATENT DOCUMENTS

| JP | S59-132196 A | 7/1984 |
|---|---|---|
| JP | H01-283900 A | 11/1989 |
| JP | H02-078299 A | 3/1990 |
| JP | H10-064714 A | 3/1998 |
| JP | H11-214592 | 6/1999 |

* cited by examiner

*Primary Examiner* — Ermias Woldegeorgis
(74) *Attorney, Agent, or Firm* — Young Law Firm, P.C.

(57) ABSTRACT

Disclosed herein is an electronic circuit package includes a substrate, an electronic component mounted on a surface of the substrate, and a magnetic mold resin covering the surface of the substrate so as to embed therein the electronic component. The magnetic mold resin includes a resin material and a filler blended in the resin material in a blended ratio of 30 vol. % or more to 85 vol. % or less. The filler includes a magnetic filler containing Fe and 32 wt. % or more and 39 wt. % or less of a metal material contained mainly of Ni, thereby a thermal expansion coefficient of the magnetic mold resin is 15 ppm/° C. or less.

19 Claims, 29 Drawing Sheets

COMPOSITION 1

| | | |
|---|---:|---|
| Fe | 54.81 | wt% |
| Ni | 45.00 | wt% |
| Co | 0.00 | wt% |
| Mn | 0.12 | wt% |
| Cr | 0.068 | wt% |
| D10 | 7.25 | μm |
| D50 | 19.86 | μm |
| D90 | 31.77 | μm |

COMPOSITION 2

| | | |
|---|---:|---|
| Fe | 64.38 | wt% |
| Ni | 35.50 | wt% |
| Co | 0.00 | wt% |
| Mn | 0.10 | wt% |
| Cr | 0.019 | wt% |
| D10 | 7.10 | μm |
| D50 | 20.01 | μm |
| D90 | 32.42 | μm |

COMPOSITION 3

| | | |
|---|---:|---|
| Fe | 63.08 | wt% |
| Ni | 32.00 | wt% |
| Co | 4.76 | wt% |
| Mn | 0.14 | wt% |
| Cr | 0.019 | wt% |
| D10 | 6.60 | μm |
| D50 | 18.95 | μm |
| D90 | 31.05 | μm |

FIG. 33

THERMAL EXPANSION COEFFICIENT [ppm/°C]

| FILLER | FILLER CONTENT (vol.%) | | |
|---|---|---|---|
|  | 50 | 60 | 70 |
| $SiO_2$ | 29.7 | 17.1 | 8.2 |
| COMPOSITION 1 | 60.0 | 25.4 | 15.1 |
| COMPOSITION 2 | 44.7 | 19.8 | 9.9 |
| COMPOSITION 3 | 41.5 | 17.8 | 8.8 |

FIG. 34

PERMEABILITY

| FILLER | FILLER CONTENT (vol.%) | | |
|---|---|---|---|
|  | 50 | 60 | 70 |
| COMPOSITION 1 | 8.3 | 10.6 | 12.6 |
| COMPOSITION 2 | 8.4 | 11.1 | 12.5 |
| COMPOSITION 3 | 8.2 | 11.0 | 12.1 |

FIG. 35

ELECTRONIC CIRCUIT PACKAGE USING COMPOSITE MAGNETIC SEALING MATERIAL

BACKGROUND OF THE INVENTION

Field of the Invention

The present invention relates to an electronic circuit package and, more particularly, to an electronic circuit package using a composite magnetic sealing material.

Description of Related Art

In recent years, an electronic device such as a smartphone is equipped with a high-performance radio communication circuit and a high-performance digital chip, and an operating frequency of a semiconductor IC used therein tends to increase. Further, adoption of an SIP (System-In Package) having a 2.5D or 3D structure, in which a plurality of semiconductor ICs are connected by a shortest wiring, is accelerated, and modularization of a power supply system is expected to accelerate. Further, an electronic circuit module having a large number of modulated electronic components (collective term of components, such as passive components (an inductor, a capacitor, a resistor, a filter, etc.), active components (a transistor, a diode, etc.), integrated circuit components (an semiconductor IC, etc.) and other components required for electronic circuit configuration) is expected to become more and more popular, and an electronic circuit package which is a collective term for the above SIP, electronic circuit module, and the like tends to be mounted in high density along with sophistication, miniaturization, and thinning of an electronic device such as a smartphone. However, this tendency poses a problem of malfunction and radio disturbance due to noise. The problem of malfunction and radio disturbance is difficult to be solved by conventional noise countermeasure techniques. Thus, recently, self-shielding of the electronic circuit package has become accelerated, and an electromagnetic shielding using a conductive paste or a plating or sputtering method has been proposed and put into practical use, and higher shielding characteristics are required in the future.

To achieve this, recently, there are proposed electronic circuit packages in which a molding material itself has magnetic shielding characteristics. For example, Japanese Patent Application Laid-Open No. H10-64714 discloses a composite magnetic sealing material added with soft magnetic powder having an oxide film as a molding material for electronic circuit package.

However, conventional composite magnetic sealing materials have a drawback in that it has a large thermal expansion coefficient. Thus, a mismatch occurs between a composite magnetic sealing material and a package substrate or electronic components in terms of the thermal expansion coefficient. As a result, an aggregated substrate having a strip shape after molding may be greatly warped, or there may occur a warp large enough to cause a problem with connectivity of an electronic circuit package in a diced state in mounting reflow. This phenomenon will be described in detail below.

In recent years, various structures have been proposed for and actually put into practical use as a semiconductor package or an electronic component module, and, currently, there is generally adopted a structure in which electronic components such as semiconductor ICs are mounted on an organic multilayer substrate, followed by molding of the upper portion and periphery of the electronic component package by a resin sealing material. A semiconductor package or electronic component module having such a structure is molded as an aggregated substrate, followed by dicing.

In this structure, an organic multilayer substrate and a resin sealing material having different physical properties constitute a so-called bimetal, so that a warp may occur due to the difference between thermal expansion coefficients, glass transition, or curing shrinkage of a molding material. To suppress the warp, it is necessary to make the physical properties such as thermal expansion coefficients coincide with each other as much as possible. In recent years, an organic multilayer substrate used for a semiconductor package or an electronic circuit module is getting thinner and thinner and is increasing in the number of layers thereof to meet requirements for height reduction. In order to realize high rigidity and low thermal expansion for ensuring good handleability of a thin substrate while achieving the thickness reduction and multilayer structure, use of a substrate material having a high glass transition temperature, addition of a filler having a small thermal expansion coefficient to a substrate material, or use of glass cloth having a smaller thermal expansion coefficient is a common practice at present.

On the other hand, the difference in physical properties between semiconductor ICs and electronic components mounted on a substrate and a molding material also generates a stress, causing various problems such as interfacial delamination of the molding material and crack of the electronic components or molding material. Incidentally, silicon is used as the semiconductor ICs. The thermal expansion coefficient of silicon is 3.5 ppm/° C., and that of a baked chip component such as a ceramic capacitor or an inductor is about 10 ppm/° C.

Thus, the molding material is also required to have a small thermal expansion coefficient, and some commercially-available materials have a thermal expansion coefficient below 10 ppm/° C. As a method for reducing the thermal expansion coefficient of the molding material, adopting an epoxy resin having a small thermal expansion coefficient, as well as, blending molten silica having a very small thermal expansion coefficient of 0.5 ppm/° C. in a sealing resin at a high filling rate can be taken.

General magnetic materials have a high thermal expansion coefficient. Thus, as described in Japanese Patent Application Laid-Open No. H10-64714, the composite magnetic sealing material obtained by adding general soft magnetic powder to a mold resin cannot achieve a target small thermal expansion coefficient.

SUMMARY

An object of the present invention is therefore to provide an electronic circuit package using a composite magnetic sealing material having a small thermal expansion coefficient.

An electronic circuit package according to the present invention includes a substrate an electronic component mounted on a surface of the substrate, and a magnetic mold resin covering the surface of the substrate so as to embed therein the electronic component. The magnetic mold resin includes a resin material and a filler blended in the resin material in a blended ratio of 30 vol. % or more to 85 vol. % or less. The filler includes a magnetic filler containing Fe and 32 wt. % or more and 39 wt. % or less of a metal material contained mainly of Ni, thereby a thermal expansion coefficient of the magnetic mold resin is 15 ppm/° C. or less.

According to the present invention, the thermal expansion coefficient of the magnetic mold resin composed of the composite magnetic sealing material can be reduced to 15 ppm/° C. or less by using the magnetic filler having a small thermal expansion coefficient. Thus, when the composite magnetic sealing material according to the present invention is used as a molding material for an electronic circuit package, it is possible to prevent the warp of the substrate, interfacial delamination or crack of a molding material.

In the present invention, the metal material may further contain 0.1 wt. % or more and 8 wt. % or less of Co relative to the total weight of the magnetic filler. This enables a further reduction in the thermal expansion coefficient of the magnetic mold resin composed of the composite magnetic sealing material.

In the present invention, the filler may further include a non-magnetic filler. This enables a further reduction in the thermal expansion coefficient of the magnetic mold resin composed of the composite magnetic sealing material. In this case, the ratio of the amount of the non-magnetic filler relative to the sum of the amounts of the magnetic filler and the non-magnetic filler is preferably 1 vol. % or more and 40 vol. % or less. This enables a further reduction in the thermal expansion coefficient of the magnetic mold resin composed of the composite magnetic sealing material while ensuring sufficient magnetic characteristics. In this case, the non-magnetic filler preferably contains at least one material selected from the group consisting of $SiO_2$, $ZrW_2O_8$, $(ZrO)_2P_2O_7$, $KZr_2(PO_4)_3$, or $Zr_2(WO_4)(PO_4)_2$. These materials have a very small or negative thermal expansion coefficient, thus enabling a further reduction in the thermal expansion coefficient of the magnetic mold resin composed of the composite magnetic sealing material.

In the present invention, the magnetic filler preferably has a substantially spherical shape. This enables an increase in the ratio of the magnetic filler to the composite magnetic sealing material.

In the present invention, the surface of the magnetic filler is preferably insulatively coated, and the film thickness of the insulating coating is preferably 10 nm or more. With this configuration, the volume resistivity of the magnetic mold resin composed of the composite magnetic sealing material can be increased to, e.g., $10^{10}$ Ω cm or more, making it possible to ensure insulating performance required for a molding material for an electronic circuit package.

In the present invention, the resin material is preferably a thermosetting resin material, and the thermosetting resin material preferably contains at least one material selected from the group consisting of an epoxy resin, a phenol resin, a urethane resin, a silicone resin, or an imide resin.

The electronic circuit package according to the present invention may further include a non-magnetic member provided between the electronic component and the magnetic mold resin. With this configuration, it is possible to suppress fluctuation of characteristics of the electronic component due to proximity between the electronic component and the magnetic mold resin.

It is preferable that the electronic circuit package further includes a metal film covering the magnetic mold resin, wherein the metal film is connected to a power supply pattern provided in the substrate. With this configuration, a composite shielding structure having both an electromagnetic shielding function and a magnetic shielding function can be obtained.

Preferably, in the present invention, the metal film is mainly composed of at least one metal selected from a group consisting of Au, Ag, Cu, and Al, and more preferably, the surface of the metal film is covered with an antioxidant film. In the present invention, it is preferable that the power supply pattern is exposed to a side surface of the substrate and that the metal film contacts the exposed power supply pattern. With this configuration, it is possible to easily and reliably connect the metal film to the power supply pattern.

As described above, the electronic circuit package according to the present invention includes the magnetic mold resin having a small thermal expansion coefficient. Thus, it is possible to prevent the warp of the substrate, interfacial delamination or crack of a molding material with obtaining the magnetic shielding characteristics.

BRIEF DESCRIPTION OF THE DRAWINGS

The above features and advantages of the present invention will be more apparent from the following description of certain preferred embodiments taken in conjunction with the accompanying drawings, in which:

FIG. 33 is a table indicating compositions 1 to 3; and

FIGS. 34 and 35 are tables indicating measurement results of the Examples.

DETAILED DESCRIPTION OF THE EMBODIMENTS

Preferred embodiments of the present invention will be explained below in detail with reference to the accompanying drawings.

<First Embodiment>

Figure 1:
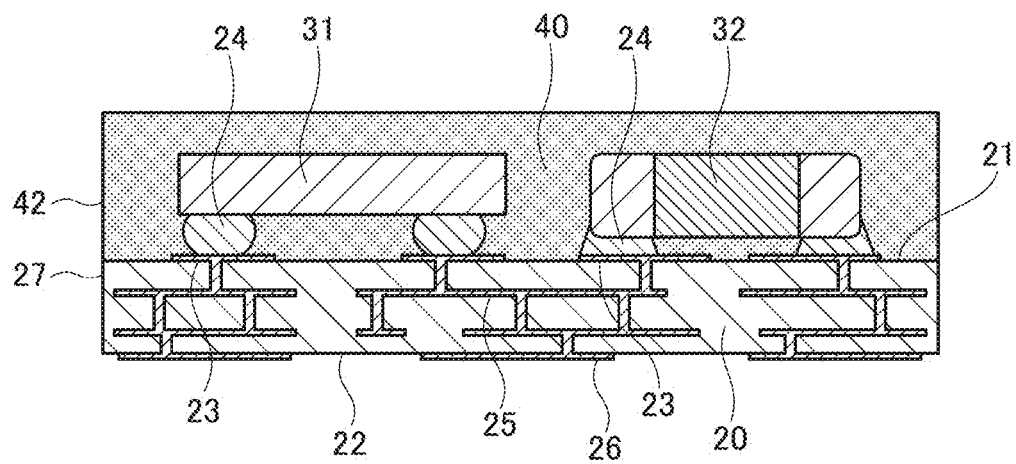
FIG. 1 is a cross-sectional view illustrating a configuration of an electronic circuit package according to a first embodiment of the present invention.

FIG. 1 is a cross-sectional view illustrating a configuration of an electronic circuit package 11A according to the first embodiment of the present invention.

As illustrated in FIG. 1, the electronic circuit package 11A according to the present embodiment includes a substrate 20, a plurality of electronic components 31 and 32 mounted on the substrate 20, and a magnetic mold resin 40 covering a front surface 21 of the substrate 20 so as to embed the electronic components 31 and 32.

Although the type of the electronic circuit package 11A according to the present embodiment is not especially limited, examples thereof include a high-frequency module handling a high-frequency signal, a power supply module performing power supply control, an SIP (System-In-Package) having a 2.5D structure or a 3D structure, and a semiconductor package for radio communication or digital circuit. Although only two electronic components 31 and 32 are illustrated in FIG. 1, more electronic components are incorporated actually.

The substrate 20 has a double-sided and multilayer wiring structure in which a large number of wirings are embedded therein and may be any type of substrate including: a thermosetting resin based organic substrate such as an FR-4, an FR-5, a BT, a cyanate ester substrate, a phenol substrate, or an imide substrate; a thermoplastic resin based organic substrate such as a liquid crystal polymer; an LTCC substrate; an HTCC substrate; and a flexible substrate. In the present embodiment, the substrate 20 has a four-layer structure including wiring layers formed on the front surface 21 and a back surface 22 and two wiring layers embedded therein. Land patterns 23 are an internal electrode for connecting to the electronic components 31 and 32. The land patterns 23 and each of the electronic components 31 and 32 are electrically and mechanically connected to each other through a respective solder 24 (or a conductive paste). For example, the electronic component 31 is a semiconductor chip such as a controller, and electronic component 32 is a passive component such as a capacitor or a coil. Some electronic components (e.g., thinned semiconductor chip) may be embedded in the substrate 20.

The land patterns 23 are connected to external terminals 26 formed on the back surface 22 of the substrate 20 through internal wirings 25 formed inside the substrate 20. Upon actual use, the electronic circuit package 11A is mounted on an unillustrated mother board, and land patterns on the mother board and the external terminals 26 of the electronic circuit package 11A are electrically connected. A material for a conductor forming the land patterns 23, internal wirings 25, and external terminals 26 may be a metal such as copper, silver, gold, nickel, chrome, aluminum, palladium, indium, or a metal alloy thereof or may be a conductive material using resin or glass as a binder; however, when the substrate 20 is an organic substrate or a flexible substrate, copper or silver is preferably used in terms of cost and conductivity. The above conductive materials may be formed by using various methods such as printing, plating, foil lamination, sputtering, vapor deposition, and inkjet.

The magnetic mold resin 40 covers the front surface 21 of the substrate 20 so as to embed the electronic components 31 and 32 therein. The magnetic mold resin 40 is a mold member and serves also as a magnetic shielding. In the present embodiment, a side surface 42 of the magnetic mold resin 40 and a side surface 27 of the substrate 20 form the same plane. Although details of the magnetic mold resin 40 will be explained later, the magnetic mold resin 40 composed of a composite magnetic sealing material having very small thermal expansion coefficient (15 ppm/° C. or less for example) compared with a conventional magnetic sealing material. The magnetic mold resin 40 contacts the electronic components 31, 32 and land patterns 23, so that the volume resistance thereof needs to be sufficiently large. Specifically, it is desirable that the volume resistance is equal to or larger than $10^{10}$ Ω cm.

Figure 2:
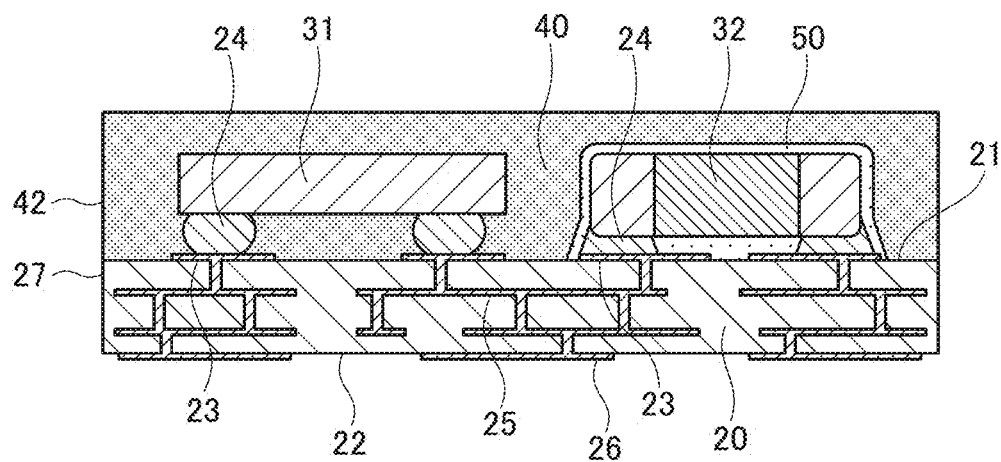
FIG. 2 is a cross-sectional view illustrating a configuration of an electronic circuit package according to a first modification of the first embodiment.

Further, when a distance between an electronic component such as a high-frequency inductor and the magnetic mold resin 40 is too small, characteristics thereof such as an inductance value may fluctuate from a design value. In such a case, the fluctuation of the characteristics can be reduced by covering a part of or the entire electronic component with a non-magnetic member. FIG. 2 is a cross-sectional view illustrating a configuration of an electronic circuit package 11B according to a modification. The electronic circuit package 11B of FIG. 2 differs from the electronic circuit package 11A of FIG. 1 in that the electronic component 32 is covered with a non-magnetic member 50. As the non-magnetic member 50, a common resin can be used. By interposing the non-magnetic member 50 between the electronic component 32 and the magnetic mold resin 40, a sufficient distance between the electronic component 32 and magnetic mold resin 40 can be ensured, so that it is possible to reduce the fluctuation of characteristics such as the inductance value.

The following describes a manufacturing method for the electronic circuit package 11A according to the present embodiment.

Figure 3:
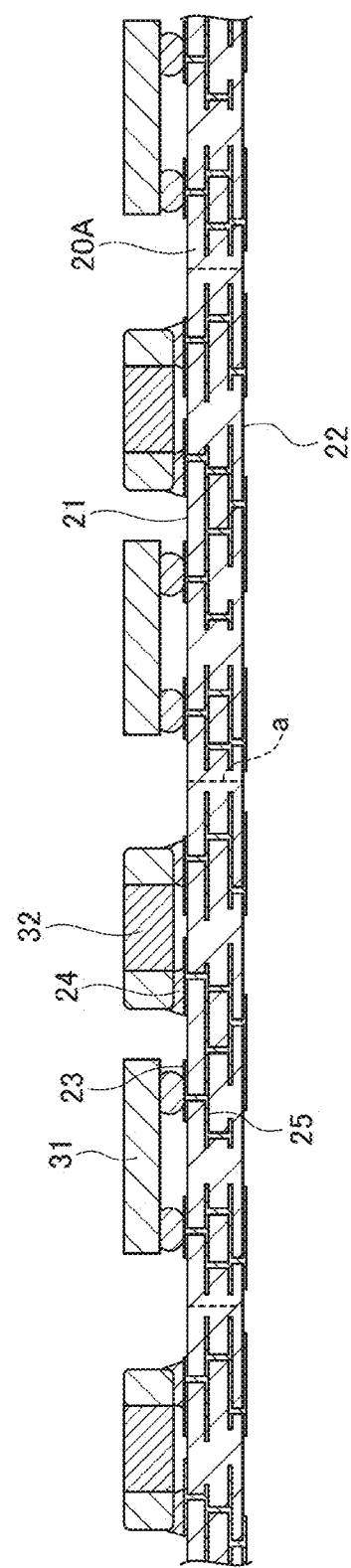
FIGS. 3 to 5 are process views for explaining a manufacturing method for the electronic circuit package shown in FIG. 1.
Figure 4:
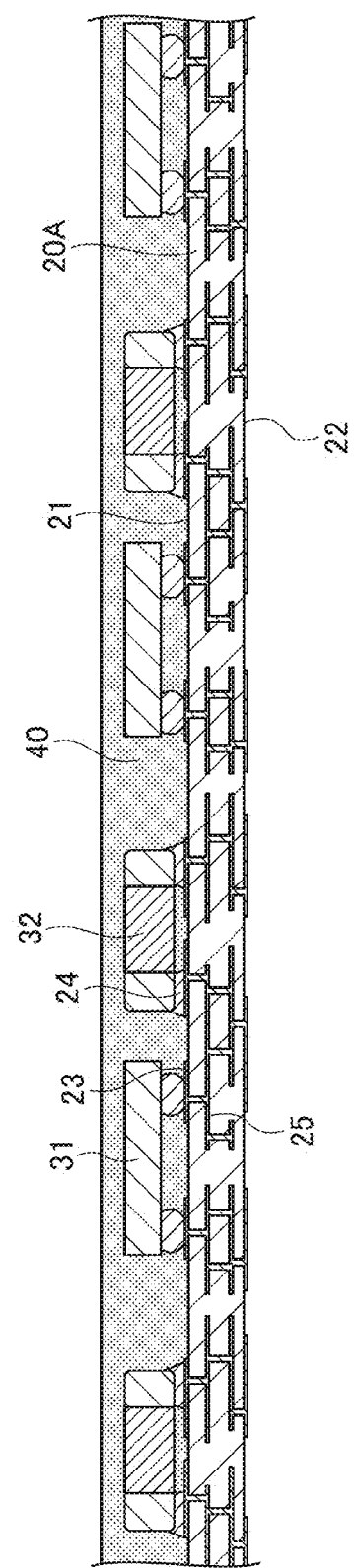
Figure 5:
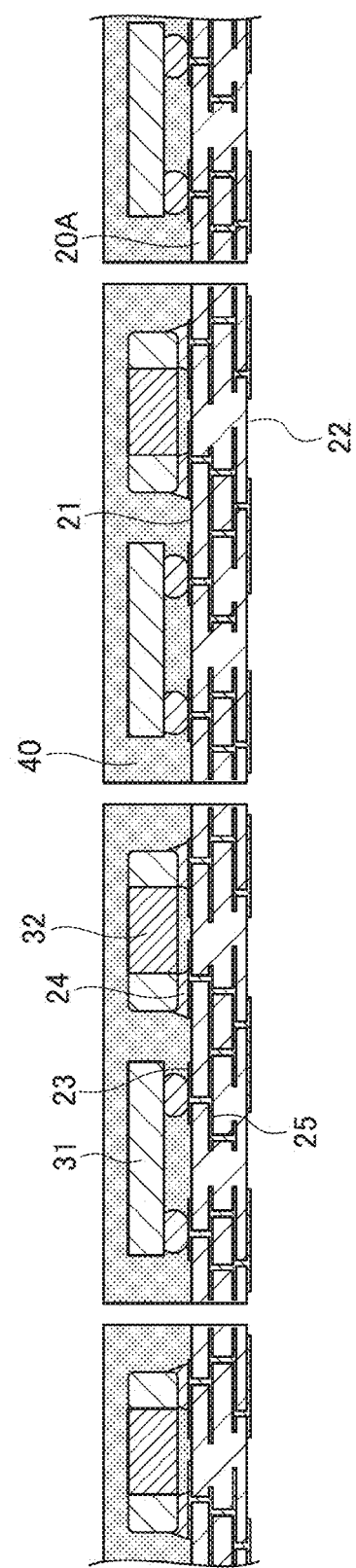

FIGS. 3 to 5 are process views for explaining a manufacturing method for the electronic circuit package 11A.

As illustrated in FIG. 3, an assembly substrate 20A having a multilayer wiring structure is prepared. A plurality of the land patterns 23 are formed on the front surface 21 of the assembly substrate 20A, and a plurality of the external terminals 26 are formed on the back surface 22 of the assembly substrate 20A. Further, a plurality of the internal wirings 25 are formed in an inner layer of the assembly substrate 20A. A dashed line a in FIG. 3 denotes a part to be cut in a subsequent dicing process.

Then, as illustrated in FIG. 3, the plurality of electronic components 31 and 32 are mounted on the front surface 21 of the assembly substrate 20A so as to be connected to the land patterns 23. Specifically, the solder 24 is provided on the land pattern 23, followed by mounting of the electronic components 31 and 32 and by reflowing, whereby the electronic components 31 and 32 are connected to the land patterns 23.

Then, as illustrated in FIG. 4, the front surface 21 of the assembly substrate 20A is covered with the magnetic mold resin 40 so as to embed the electronic components 31 and 32 in the magnetic mold resin 40. Examples of the formation method for the magnetic mold resin 40 may include transfer molding, compression molding, injection molding, cast molding, vacuum cast molding, dispense molding, and molding using a slit nozzle.

Then, as illustrated in FIG. 5, the assembly substrate 20A is cut along the dashed line a to divide the assembly substrate 20A into individual substrates 20, whereby the electronic circuit package 11A according to the present embodiment is completed.

The following describes details of the composite magnetic sealing material constituting the magnetic mold resin 40.

Figure 6:
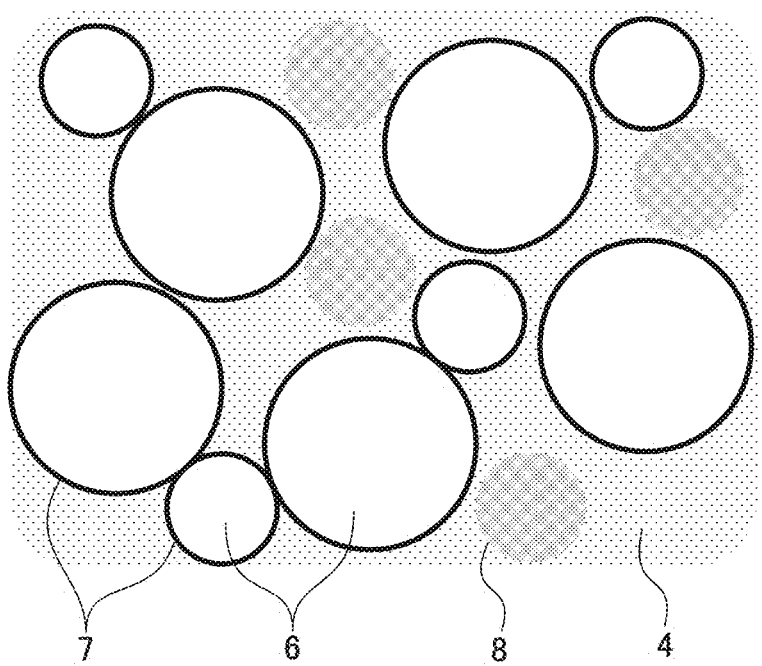
FIG. 6 is a schematic view for explaining a configuration of a composite magnetic sealing material.

FIG. 6 is a schematic view for explaining a configuration of a composite magnetic sealing material constituting the magnetic mold resin 40.

As illustrated in FIG. 6, a composite magnetic sealing material 2 constituting the magnetic mold resin 40 includes a resin material 4, and a magnetic filler 6 and a non-magnetic filler 8 which are blended in the resin material 4. Although not especially limited, the resin material 4 is preferably composed mainly of a thermosetting resin material. Specifically, the resin material 4 is preferably composed mainly of an epoxy resin, a phenol resin, a urethane resin, a silicone resin, or an imide resin and more preferably uses a base resin and a curing agent used for an epoxy resin-based or a phenol resin-based semiconductor sealing material.

The most preferable is the epoxy resin having a reactive epoxy group at its terminal, which can be combined with various types of curing agents and curing accelerators. Examples of the epoxy resin include a bisphenol A epoxy resin, a bisphenol F epoxy resin, a phenoxy type epoxy resin, a naphthalene type epoxy resin, a multifunctional-type epoxy resin (dicyclopentadiene type epoxy resin, etc.), a biphenyl-type (bifunctional) epoxy resin, and an epoxy resin having a special structure. Among them, the biphenyl type epoxy resin, naphthalene type epoxy resin, and dicyclopentadiene type epoxy resin are useful since they can attain low thermal expansion. Examples of the curing agent or curing accelerator include amine-based compound alicyclic diamine, aromatic diamine, other amine-based compounds (imidazole, tertiary amine, etc.), an acid anhydride compound (high-temperature curing agent, etc.), a phenol resin (novolac type phenol resin, cresol novolac type phenol resin, etc.), an amino resin, dicyandiamide, and a Lewis acid complex compound. For material kneading, known means such as a kneader, three-roll mills, or a mixer may be used.

The magnetic filler 6 is formed of an Fe—Ni based material and contains 32 wt. % or more and 39 wt. % or less of a metal material composed mainly of Ni. The remaining 61-68 wt. % is Fe. The blending ratio of the magnetic filler 6 to the composite magnetic sealing material 2 is 30 vol. % or more and 85 vol. % or less. When the blending ratio of the magnetic filler 6 is less than 30 vol. %, it is difficult to obtain sufficient magnetic characteristics; on the other hand, when the blending ratio of the magnetic filler 6 exceeds 85 vol. %, it is difficult to ensure characteristics, such as flowability, required for a sealing material.

The metal material composed mainly of Ni may contain a small amount of Co. That is, a part of Ni may be substituted by Co. The containment of Co enables a further reduction in the thermal expansion coefficient of the composite magnetic sealing material 2. The adding amount of Co to the composite magnetic sealing material 2 is preferably 0.1 wt. % or more and 8 wt. % or less.

The shape of the magnetic filler 6 is not especially limited. However, the magnetic filler 6 may preferably be formed into a spherical shape for high packing density. Further, fillers of different particle sizes may be blended as the magnetic filler 6 for closest packing. Further, forming the magnetic filler 6 into a spherical shape (or substantially a spherical shape) enables a reduction in damage to electronic components during molding. Particularly, for high packing density or closest packing, the shape of the magnetic filler 6 is preferably a true sphere. The magnetic filler 6 preferably has a high tap density and a small specific surface area. As a formation method for the magnetic filler 6, there are known a water atomization method, a gas atomization method, and a centrifugal disc atomization method. Among them, the gas atomization method is most preferable since it can achieve a high tap density and reduce the specific surface area.

Although not especially limited, the surface of the magnetic filler 6 is covered with an insulating coat 7 formed of an oxide of metal such as Si, Al, Ti, or Mg or an organic material for enhancement of flowability, adhesion, and insulation performance. To sufficiently enhance the volume resistivity of the composite magnetic sealing material 2, the film thickness of the insulating coat 7 is preferably set to 10 nm or more. The insulating coat 7 may be achieved by coating a thermosetting material on the surface of the magnetic filler 6 or may be achieved by formation of an oxide film by hydration of metal alkoxide such as tetraethyloxysilane or tetraemthyloxysilane and, most preferably, it is achieved by formation of a silicon oxide coating film. Further, more preferably, organofunctional coupling treatment is applied to the insulating coat 7.

In this embodiment, the composite magnetic sealing material 2 contains the non-magnetic filler 8. As the non-magnetic filler 8, a material having a smaller thermal expansion coefficient than that of the magnetic filler 6, such as $SiO_2$, $ZrW_2O_2$, $(ZrO)_2P_2O_7$, $KZr_2(PO_4)_3$, or $Zr_2(WO_4)(PO_4)_2$, or a material having a negative thermal expansion coefficient is preferably used. By adding the non-magnetic filler 8 to the composite magnetic sealing material 2, it is possible to further reduce the thermal expansion coefficient. Further, the following materials may be added to the composite magnetic sealing material 2: flame retardant such as aluminum oxide or magnesium oxide; carbon black, pigment, or dye for coloring; surface-treated nanosilica having a particle diameter of 100 nm or less for enhancement of slidability, flowability, and dispersibility/kneadability; and a wax component for enhancement of mold releasability. In the present invention, it is not essential that the composite magnetic sealing material constituting the magnetic mold resin 40 contains the non-magnetic filler.

Further, organofunctional coupling treatment may be applied to the surface of the magnetic filler 6 or surface of the non-magnetic filler 8 for enhancement of adhesion and flowability. The organofunctional coupling treatment may be performed using a known wet or dry method, or by an integral blend method. Further, the surface of the magnetic filler 6 or surface of the non-magnetic filler 8 may be coated with a thermosetting resin for enhancement of wettability.

When the non-magnetic filler 8 is added, the ratio of the amount of the non-magnetic filler 8 relative to the sum of the amounts of the magnetic filler 6 and the non-magnetic filler 8 is preferably 1 vol. % or more and 40 vol. % or less. In other words, 1 vol. % or more and 40 vol. % or less of the magnetic filler 6 can be substituted by the non-magnetic filler 8. When the additive amount of the non-magnetic filler 8 is less than 1 vol. %, addition effect of the non-magnetic filler 8 is hardly obtained; on the other hand, when the additive amount of the non-magnetic filler 8 exceeds 40 vol. %, the relative amount of the magnetic filler 6 is too small, resulting in difficulty in providing sufficient magnetic characteristics.

The composite magnetic sealing material 2 may be a liquid or solid, depending on selection of a base resin and a curing agent according to the molding method therefor. The composite magnetic sealing material 2 in a solid state may be formed into a tablet shape for transfer molding and into a granular shape for injection molding or compression molding. The molding method using the composite magnetic sealing material 2 may be appropriately selected from among the followings: transfer molding; compression molding; injection molding; cast molding; vacuum cast molding; vacuum printing; printing; dispensing; and a method using a slit nozzle. A molding condition may be appropriately selected from combinations of the base resin, curing agent and curing accelerator to be used. Further, after-cure treatment may be applied as needed after the molding.

Figure 7:
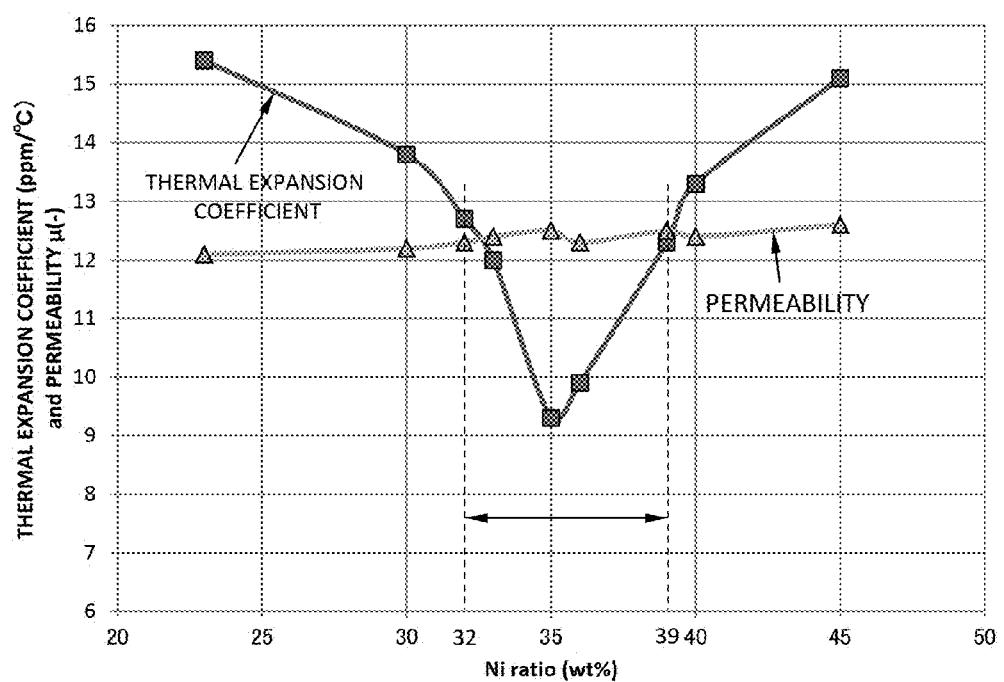
FIG. 7 is a graph illustrating the relationship between the Ni ratio of the magnetic filler and the thermal expansion coefficient and the magnetic permeability of the composite magnetic sealing material.

FIG. 7 is a graph illustrating the relationship between the Ni ratio of the magnetic filler 6 and the thermal expansion coefficient and the magnetic permeability of the composite magnetic sealing material 2. The graph of FIG. 7 represents a case where the magnetic filler 6 is composed of substantially only Fe and Ni. Here, it is assumed that the additive amount of the magnetic filler 6 relative to the composite magnetic sealing material 2 is 70 vol. % and no non-magnetic filler 8 is added to the composite magnetic sealing material 2.

As illustrated in FIG. 7, when the Ni ratio of the magnetic filler 6 is 32 wt. % or more and 39 wt. % or less, the thermal expansion coefficient of the composite magnetic sealing material 2 is remarkably reduced (it may be reduced to 10 ppm/° C. in some conditions). In the example of FIG. 7, the smallest thermal expansion coefficient (about 9.3 ppm/° C.) is obtained when the Ni ratio is about 35 wt. %. On the other hand, the magnetic permeability is not strongly correlated to the Ni ratio, and μ is 12 to 13 in the range of the Ni ratio illustrated in FIG. 7.

The reason that such characteristics are obtained is that invar characteristics where volumetric changes due to thermal expansion and magnetic distortion cancel out each other is exhibited when the Ni ratio falls within the above range. A material where the invar characteristic is exhibited is called an invar material, which is known as a material for a die requiring high precision; however, it was not used as a material for the magnetic filler to be blended in a composite magnetic sealing material. The present inventor pays attention to the magnetic characteristics and small thermal expansion coefficient that the invar material has and uses the invar material as a material for the magnetic filler and thereby realize the composite magnetic sealing material 2 having a small thermal expansion coefficient.

Figure 8:
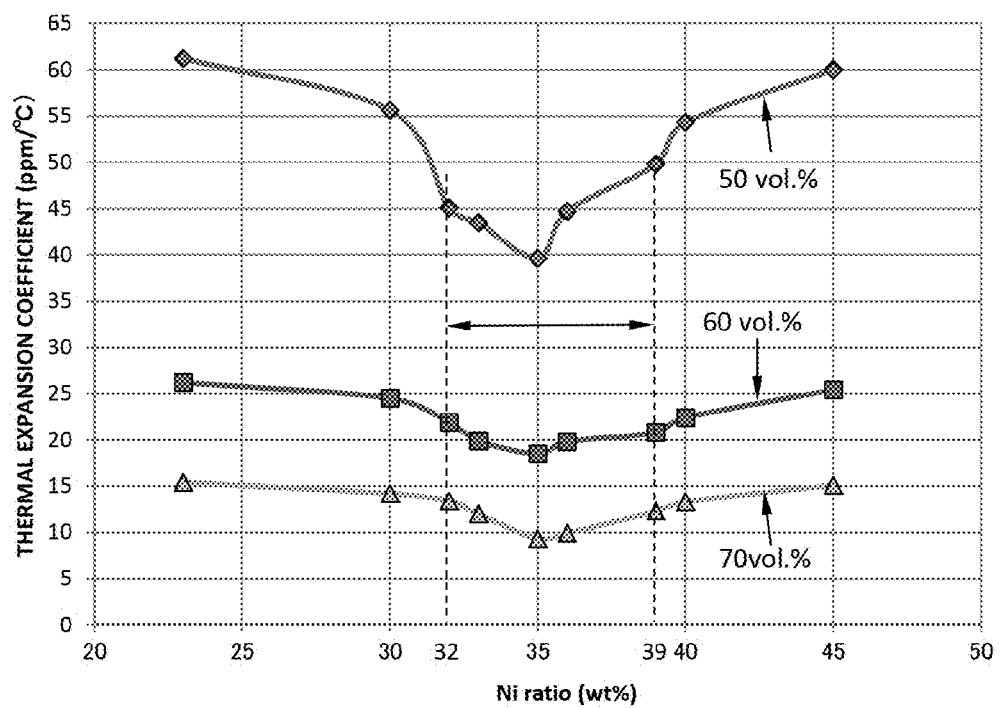
FIG. 8 is a graph illustrating the relationship between the Ni ratio of the magnetic filler and the thermal expansion coefficient of the composite magnetic sealing material.

FIG. 8 is a graph illustrating the relationship between the Ni ratio of the magnetic filler 6 and the thermal expansion coefficient of the composite magnetic sealing material 2. The graph of FIG. 8 represents a case where the magnetic filler 6 is composed substantially of only Fe and Ni. Here, it is assumed that the additive amount of the magnetic filler 6 relative to the composite magnetic sealing material 2 is 50 vol. %, 60 vol. %, or 70 vol. % and no non-magnetic filler 8 is added to the composite magnetic sealing material 2.

As illustrated in FIG. 8, even in a case where the additive amount of the magnetic filler 6 is either 50 vol. %, 60 vol. %, or 70 vol. %, when the Ni ratio of the magnetic filler 6 is 32 wt. % or more and 39 wt. % or less, the thermal expansion coefficient of the composite magnetic sealing material 2 is remarkably reduced. The more the additive amount of the magnetic filler 6 is, the smaller the thermal expansion coefficient. Therefore, when the additive amount of the magnetic filler 6 is small (e.g., 30 vol. %), the non-magnetic filler 8 formed of molten silica is further added to reduce the thermal expansion coefficient of the composite magnetic sealing material 2 to 15 ppm/° C. or less. Specifically, by setting the total additive amount of the magnetic filler 6 and the non-magnetic filler 8 to 50 vol. % or more and 85 vol. % or less, the thermal expansion coefficient of the composite magnetic sealing material 2 can be sufficiently reduced (e.g., to 15 ppm/° C. or less).

Figure 9:
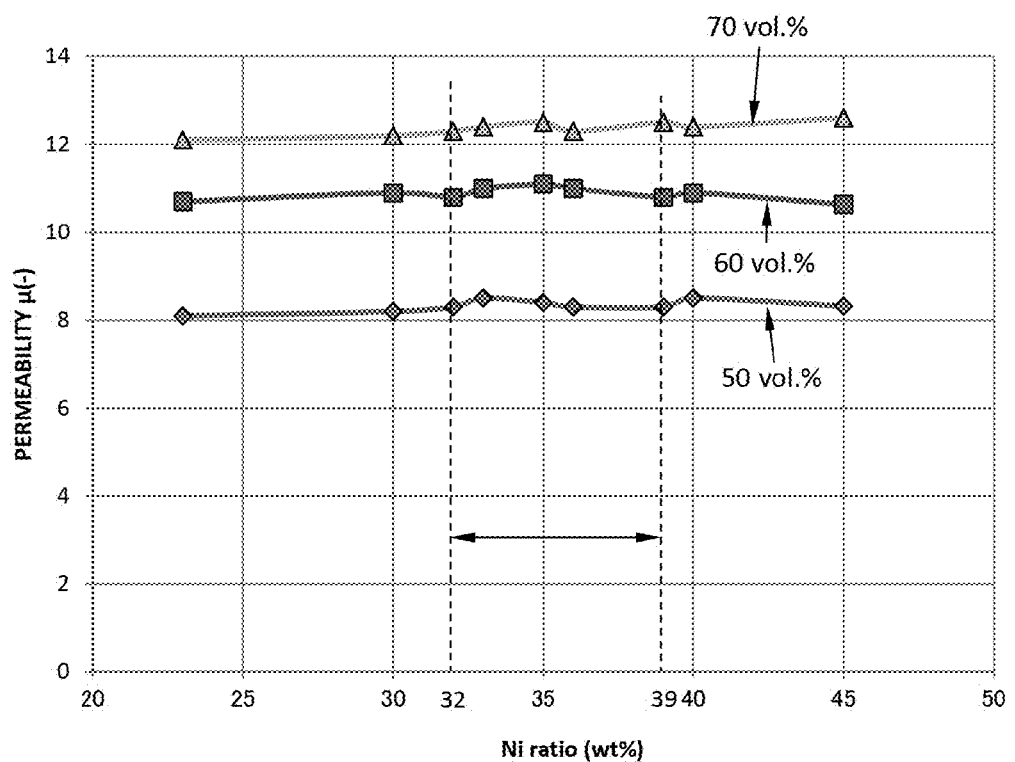
FIG. 9 is a graph illustrating the relationship between the Ni ratio of the magnetic filler and the magnetic permeability of the composite magnetic sealing material.

FIG. 9 is a graph illustrating the relationship between the Ni ratio of the magnetic filler 6 and the magnetic permeability of the composite magnetic sealing material 2. As in the case of the graph of FIG. 8, the graph of FIG. 9 represents a case where the magnetic filler 6 is composed substantially of only Fe and Ni and the additive amount of the magnetic filler 6 relative to the composite magnetic sealing material 2 is 50 vol. %, 60 vol. %, or 70 vol. %, and no non-magnetic filler 8 is added to the composite magnetic sealing material 2.

As illustrated in FIG. 9, even in a case where the additive amount of the magnetic filler 6 is either 50 vol. %, 60 vol. %, or 70 vol. %, the Ni ratio and the magnetic permeability are not strongly correlated to each other. The more the additive amount of the magnetic filler 6 is, the larger the magnetic permeability.

Figure 10:
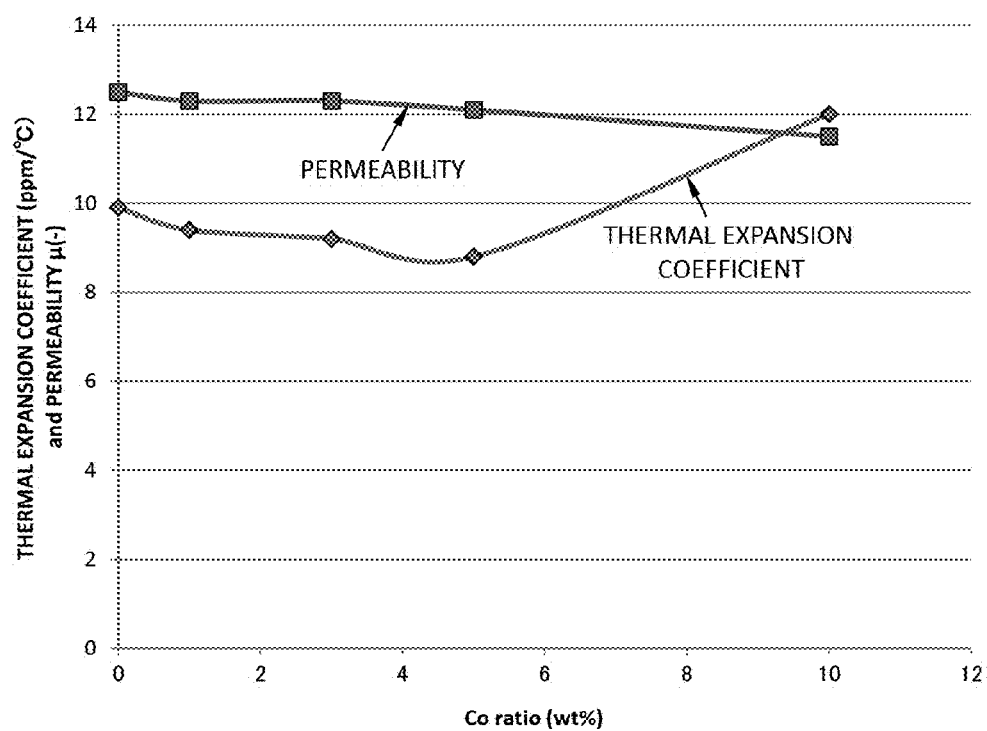
FIG. 10 is a graph illustrating the relationship between the Co ratio of the magnetic filler and the thermal expansion coefficient and magnetic permeability of the composite magnetic sealing material.

FIG. 10 is a graph illustrating the relationship between the Co ratio of the magnetic filler 6 and the thermal expansion coefficient and magnetic permeability of the composite magnetic sealing material 2. The graph of FIG. 10 represents a case where the sum of the amounts of Ni and Co contained in the magnetic filler 6 is 37 wt. %, the additive amount of the magnetic filler 6 relative to the composite magnetic sealing material 2 is 70 vol. %, and no non-magnetic filler 8 is added to the composite magnetic sealing material 2.

As illustrated in FIG. 10, as compared to a case where Co is not contained (Co=0 wt. %) in the magnetic filler 6, the thermal expansion coefficient of the composite magnetic sealing material 2 is further reduced when Ni constituting the magnetic filler 6 is substituted by 8 wt. % or less of Co. However, when the substituted amount by Co is 10 wt. %, the thermal expansion coefficient is conversely increased.

Therefore, the additive amount of Co relative to the magnetic filler 6 is preferably 0.1 wt. % or more and 8 wt. % or less.

Figure 11:
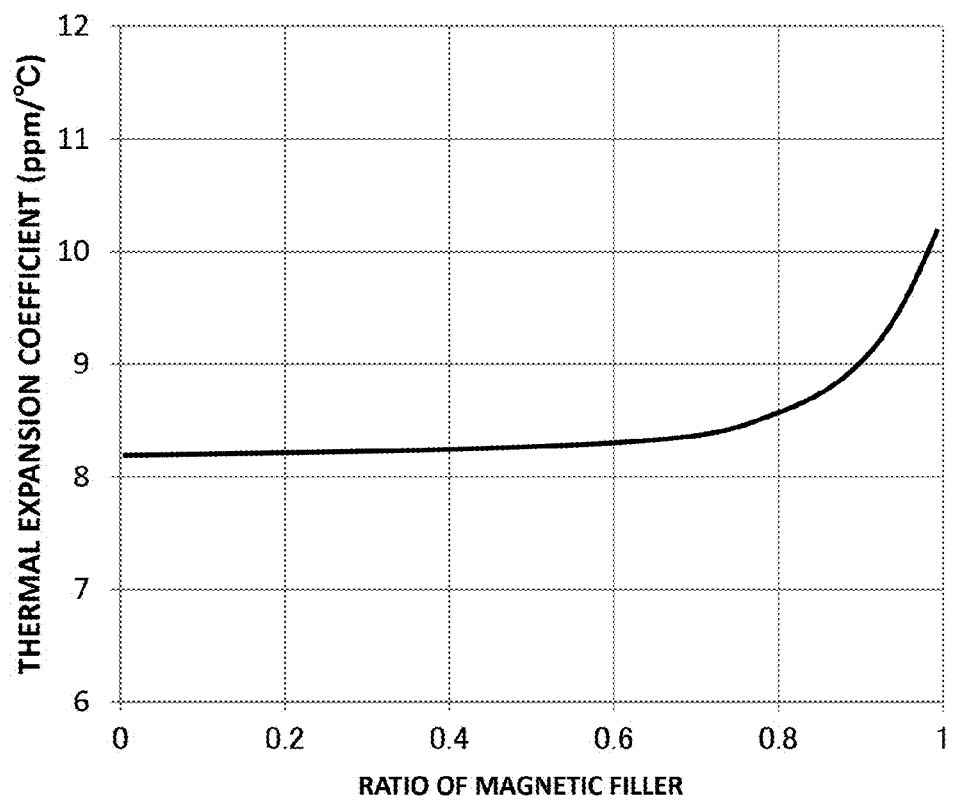
FIG. 11 is a graph illustrating the relationship between the additive ratio of the non-magnetic filler and the thermal expansion coefficient of the composite magnetic sealing material.

FIG. 11 is a graph illustrating the relationship between the additive ratio of the non-magnetic filler 8 and the thermal expansion coefficient of the composite magnetic sealing material 2. The graph of FIG. 11 represents a case where the sum of the amounts of the magnetic filler 6 and the non-magnetic filler 8 is 70 vol. %, the magnetic filler 6 is composed of 64 wt. % of Fe and 36 wt. % of Ni, and the non-magnetic filler 8 is formed of $SiO_2$.

As illustrated in FIG. 11, as the ratio of the amount of the non-magnetic filler 8 is increased, the thermal expansion coefficient of the composite magnetic sealing material 2 is reduced; however, when the amount of the non-magnetic filler 8 exceeds 40 vol. % relative to 60 vol. % of the magnetic filler 6, thermal expansion coefficient reduction effect is nearly saturated. Thus, the amount of the non-magnetic filler 8 relative to the sum of the amounts of the magnetic filler 6 and non-magnetic filler 8 is preferably 1 vol. % or more and 40 vol. % or less.

Figure 12:
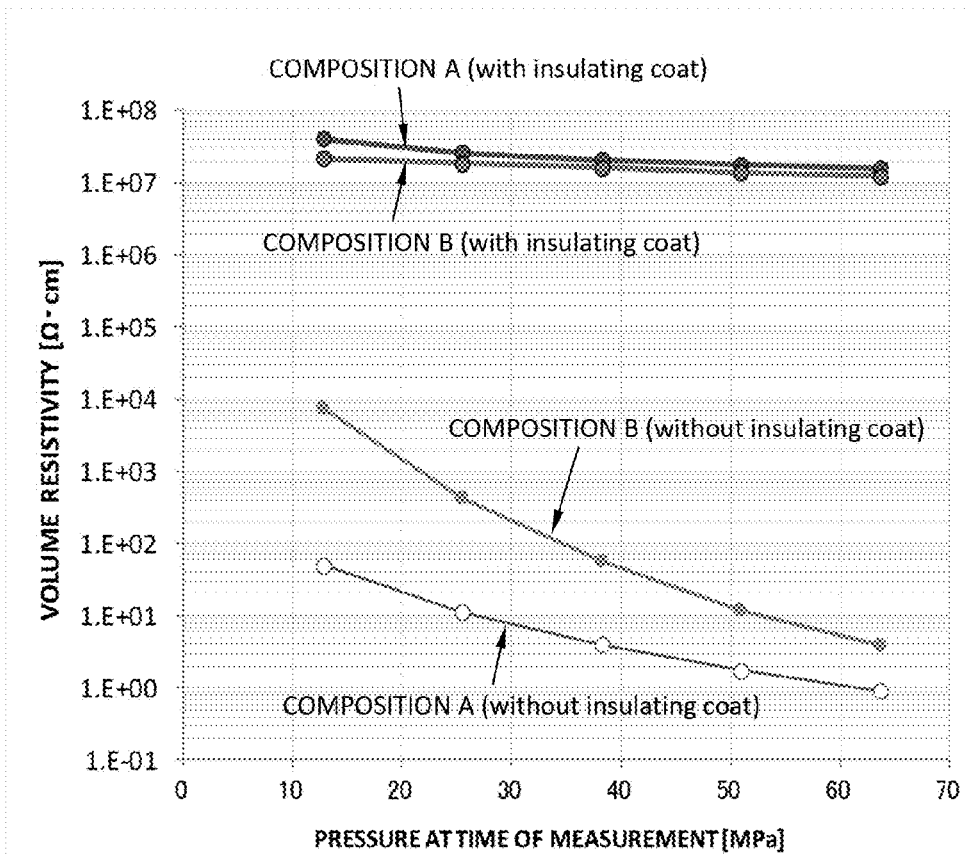
FIG. 12 is a graph illustrating the relationship between the presence/absence of the insulating coat formed on the surface of the magnetic filler and volume resistivity.

FIG. 12 is a graph illustrating the relationship between the presence/absence of the insulating coat 7 formed on the surface of the magnetic filler 6 and volume resistivity. Two compositions are prepared as a material for the magnetic filler 6 as follows: composition A (Fe=64 wt. %, Ni=36 wt. %); and composition B (Fe=63 wt. %, Ni=32 wt. %, Co=5 wt. %). The insulating coat 7 is formed of $SiO_2$ having a thickness of 40 nm. The magnetic filler 6 of either the composition A or composition B has a cut diameter of 32 μm and a particle diameter D50 of 20 μm.

As illustrated in FIG. 12, in both the composition A and composition B, coating with the insulating coat 7 significantly increases the volume resistivity of the magnetic filler 6. In addition, the coating with the insulating coat 7 reduces pressure dependency of the magnetic filler 6 at the time of measurement.

Figure 13:
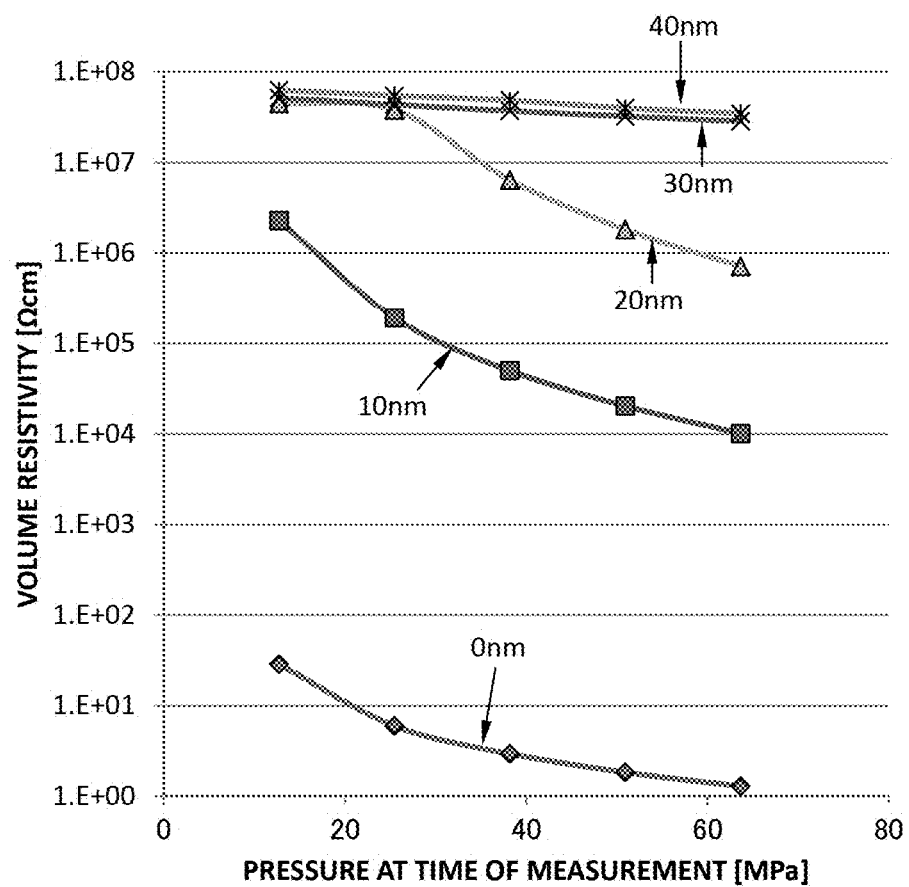
FIG. 13 is a graph illustrating the relationship between the film thickness of the insulating coat formed on the surface of the magnetic filler and volume resistivity.

FIG. 13 is a graph illustrating the relationship between the film thickness of the insulating coat 7 formed on the surface of the magnetic filler 6 and volume resistivity. The graph of FIG. 13 represents a case where the magnetic filler 6 is composed of 64 wt. % of Fe and 36 wt. % of Ni. The particle diameter of the magnetic filler 6 is equal to the particle diameter of the magnetic filler 6 in the example of FIG. 12.

As illustrated in FIG. 13, by coating the magnetic filler 6 with the insulating coat 7 having a film thickness of 10 nm or more, the volume resistivity of the magnetic filler 6 is increased. In particular, when the magnetic filler 6 is coated with the insulating coat 7 having a film thickness of 30 nm or more, a very high volume resistivity can be obtained regardless of an applied pressure at the time of measurement.

Figure 14:
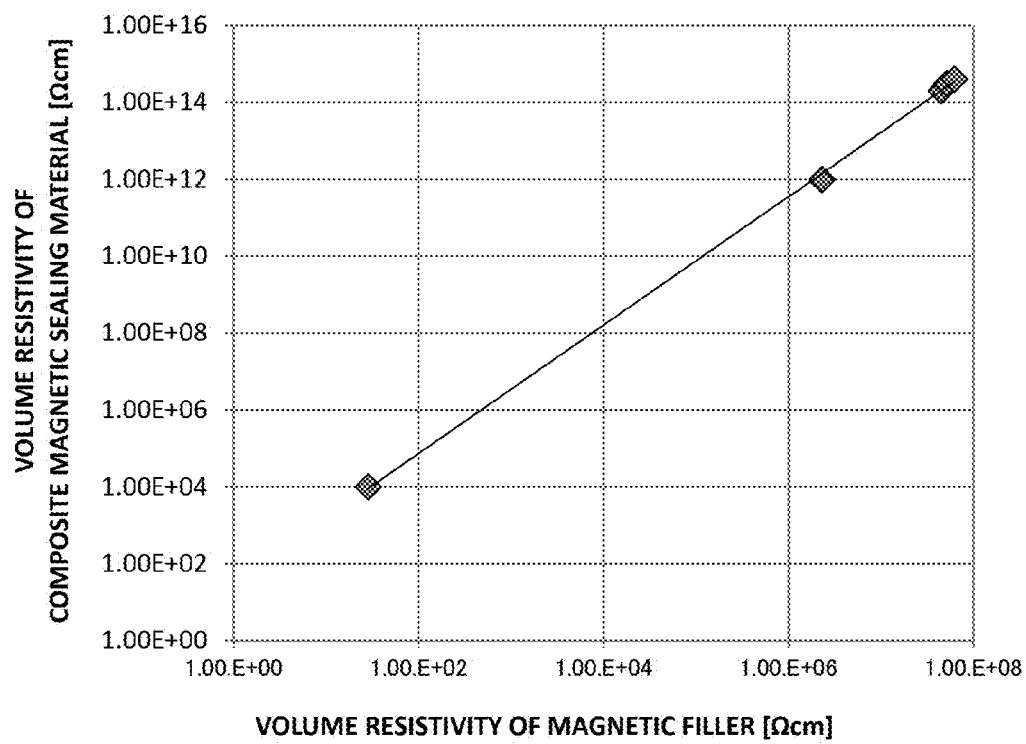
FIG. 14 is a graph illustrating the relationship between volume resistivity of the magnetic filler and that of the composite magnetic sealing material.

FIG. 14 is a graph illustrating the relationship between the volume resistivity of the magnetic filler 6 and that of the composite magnetic sealing material 2.

As illustrated in FIG. 14, the volume resistivity of the magnetic filler 6 and that of the composite magnetic sealing material 2 are in proportion to each other. In particular, when the volume resistivity of the magnetic filler 6 is $10^5$ Ω cm or more, the volume resistivity of the composite magnetic sealing material 2 can be increased to $10^{10}$ Ω cm or more. When the composite magnetic sealing material 2 having a volume resistivity of $10^{10}$ Ω cm or more is used as a molding material for electronic circuit package, a sufficient insulating performance can be ensured.

As described above, the electronic circuit packages 11A and 11B each have the magnetic mold resin 40 composed of composite magnetic sealing material 2 having very small thermal expansion coefficient. Therefore, it is possible to prevent the warp of the substrate, interfacial delamination or crack of a molding material caused due to a temperature change with obtaining the magnetic shielding characteristics.

<Second Embodiment>

Figure 15:
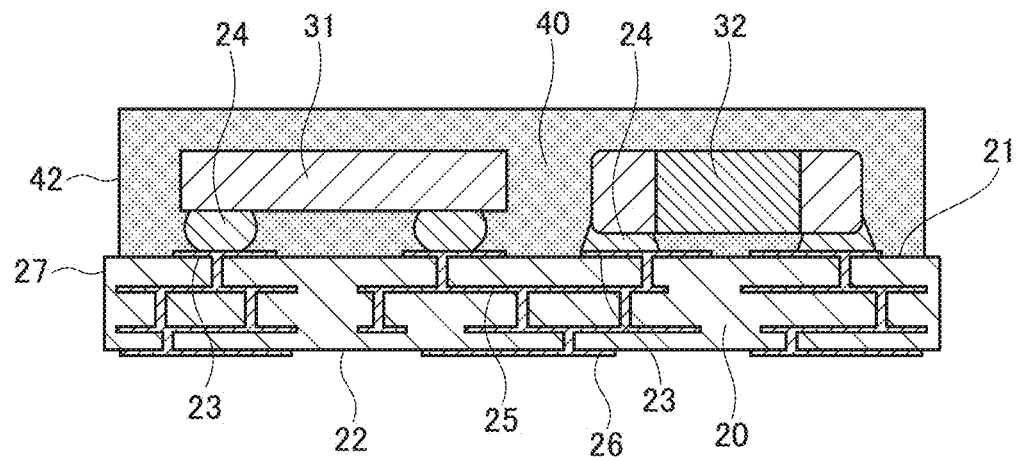
FIG. 15 is a cross-sectional view illustrating a configuration of an electronic circuit package according to a second embodiment of the present invention.

FIG. 15 is a cross-sectional view illustrating a configuration of an electronic circuit package 12A according to the second embodiment of the present invention.

As illustrated in FIG. 15, an electronic circuit package 12A according to the present embodiment differs from the electronic circuit package 11A according to the first embodiment illustrated in FIG. 1 in that a planar size of the magnetic mold resin 40 is slightly smaller than a planar size of the substrate 20 and, therefore, an outer peripheral portion of the front surface 21 of the substrate 20 is exposed from the magnetic mold resin 40. Other configurations are the same as those of the electronic circuit package 11A according to the first embodiment. Thus, in FIG. 15, the same reference numerals are given to the same elements as in FIG. 1, and repetitive descriptions will be omitted.

As exemplified by the electronic circuit package 12A according to the present embodiment, it is not essential in the present invention that the side surface 42 of the magnetic mold resin 40 and the side surface 27 of the substrate 20 form the same plane, but the planar size of the magnetic mold resin 40 may be smaller than that of the substrate 20.

Figure 16:
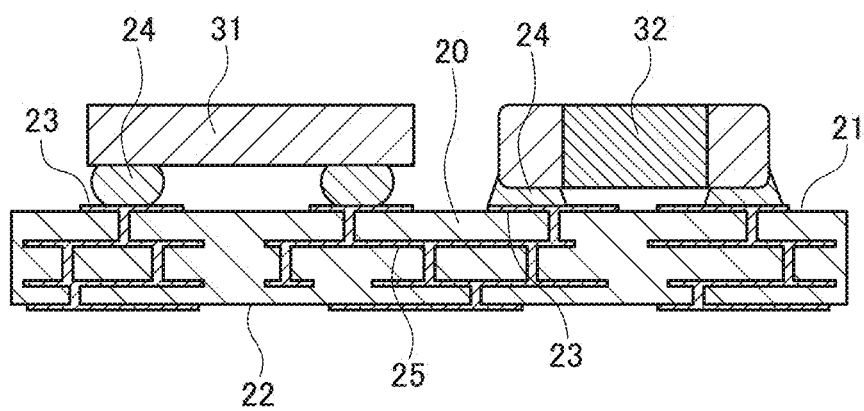
FIGS. 16 to 18 are process views for explaining a manufacturing method for the electronic circuit package shown in FIG. 15.
Figure 17:
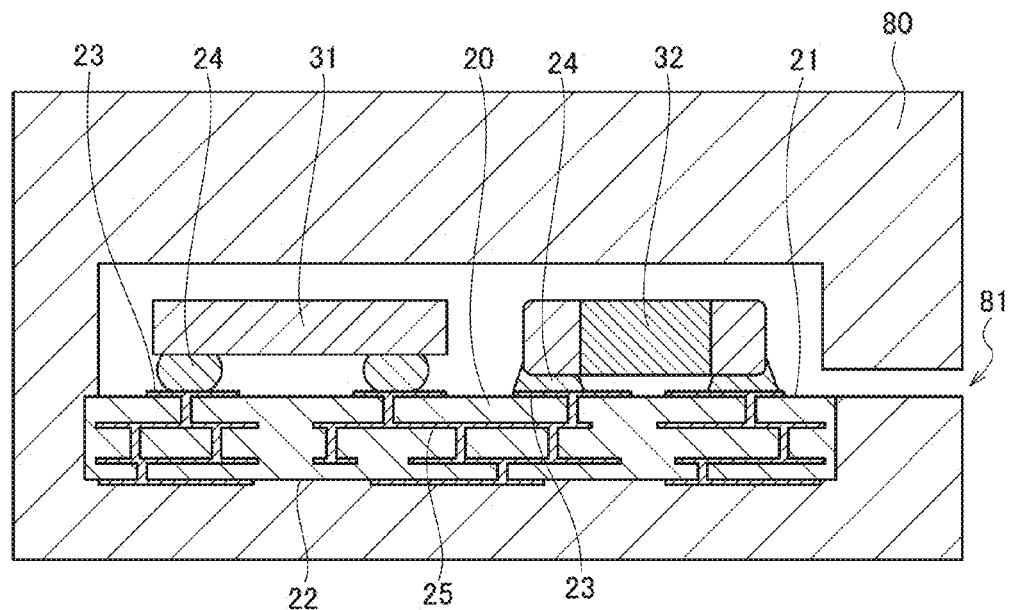
Figure 18:
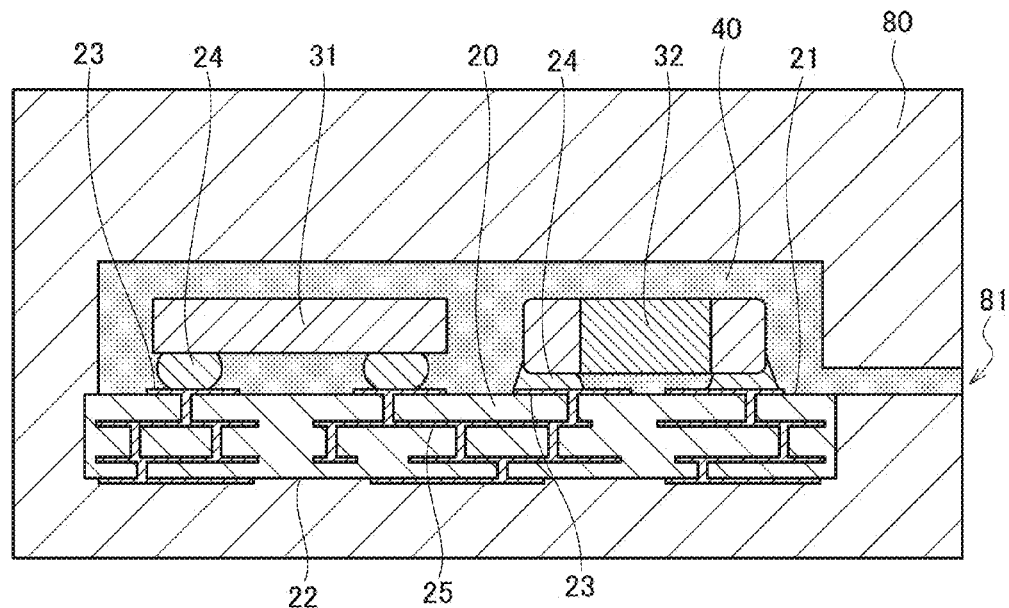

FIGS. 16 to 18 are views for explaining a manufacturing method for the electronic circuit package 12A.

First, as illustrated in FIG. 16, the substrate 20 is prepared by previously cutting the assembly substrate 20A into individual pieces, and the plurality of electronic components 31 and 32 are mounted on the substrate 20 so as to be connected to the land patterns 23 on the front surface 21 of the substrate 20. Specifically, the solder 24 is provided on the land patterns 23, followed by mounting of the electronic components 31 and 32 and by reflowing, whereby the electronic components 31 and 32 are connected to the land pattern 23.

Then, as illustrated in FIG. 17, the substrate 20 on which the electronic components 31 and 32 are mounted is set in a mold 80. Then, as illustrated in FIG. 18, a composite magnetic material which is a material forming the magnetic mold resin 40 is injected along a flow path 81 of the mold 80, followed by pressuring and heating. The electronic circuit package 12A according to the present embodiment is then completed.

As described above, the magnetic mold resin 40 may be formed after dividing the assembly substrate 20A into individual substrates 20.

<Third Embodiment>

Figure 19:
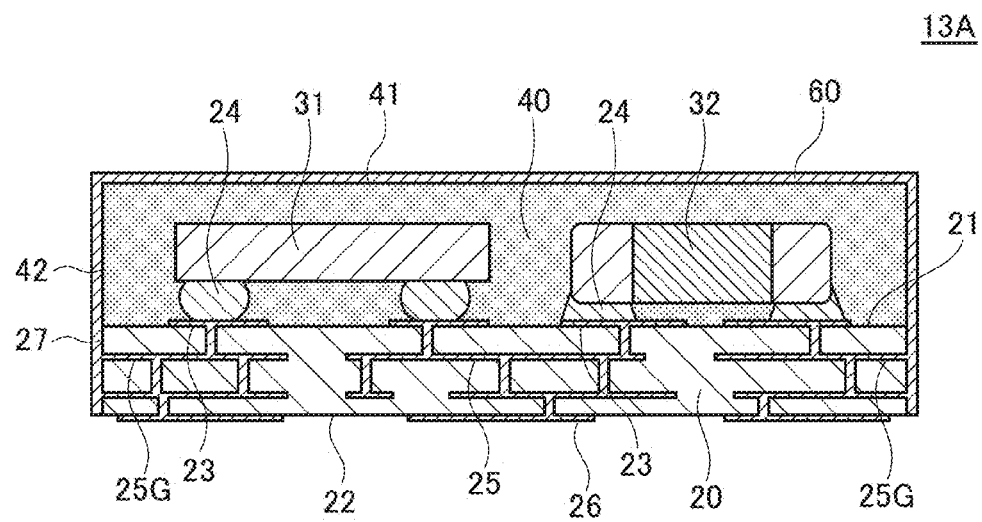
FIG. 19 is a cross-sectional view illustrating a configuration of an electronic circuit package according to a third embodiment of the present invention.

FIG. 19 is a cross-sectional view illustrating a configuration of an electronic circuit package 13A according to the third embodiment of the present invention.

As illustrated in FIG. 19, the electronic circuit package 13A according to the present embodiment differs from the electronic circuit package 11A in that it further includes a metal film 60 that covers an upper surface 41 and a side surface 42 of the magnetic mold resin 40 and covers a side surface 27 of the substrate 20. Out of the internal wirings 25 illustrated in FIG. 19, internal wirings 25G are power supply patterns. A part of the power supply patterns 25G is exposed from the substrate 20 on the side surface 27. The power supply patterns 25G are typically ground patterns to which a ground potential is to be applied; however, it is not limited to the ground patterns as long as the power supply patterns 25G are a pattern to which a fixed potential is to be applied.

Other configurations are the same as those of the electronic circuit package 11A according to the first embodiment. Thus, in FIG. 19, the same reference numerals are given to the same elements as in FIG. 1, and repetitive descriptions will be omitted.

The metal film 60 serves as an electromagnetic shielding and is preferably mainly composed of at least one metal selected from a group consisting of Au, Ag, Cu, and Al. The metal film 60 preferably has a resistance as low as possible and most preferably uses Cu in terms of cost. An outer surface of the metal film 60 is preferably covered with an anticorrosive metal such as SUS, Ni, Cr, Ti, or brass or an antioxidant film made of a resin such as an epoxy resin, a phenol resin, an imide resin, an urethane resin, or a silicone resin. The reason for this is that the metal film 60 undergoes oxidative deterioration by an external environment such as heat or humidity; and, therefore, the aforementioned treatment is preferable to suppress and prevent the oxidative deterioration. A formation method for the metal film 60 may be appropriately selected from known methods, such as a sputtering method, a vapor-deposition method, an electroless plating method, an electrolytic plating method. Before formation of the metal film 60, pretreatment for enhancing adhesion, such as plasma treatment, coupling treatment, blast treatment, or etching treatment, may be performed. As a base of the metal film 60, a high adhesion metal film such as a titanium film, a chromium film, or an SUS film may be formed thinly in advance.

As illustrated in FIG. 19, the power supply patterns 25G are exposed to the side surfaces 27 of the substrate 20. The metal film 60 covers the side surfaces 27 of the substrate 20 and is thereby connected to the power supply pattern 25G.

It is desirable that a resistance value at an interface between the metal film 60 and the magnetic mold resin 40 is equal to or larger than $10^6 \Omega$. In this case, an eddy current generated when electromagnetic wave noise enters the metal film 60 hardly flows in the magnetic mold resin 40, which can prevent deterioration in the magnetic characteristics of the magnetic mold resin 40 due to inflow of the eddy current. The resistance value at the interface between the metal film 60 and the magnetic mold resin 40 refers to a surface resistance of the magnetic mold resin 40 when the metal film 60 and magnetic mold resin 40 directly contact each other and to a surface resistance of an insulating film when the insulating film is present between the metal film 60 and the magnetic mold resin 40. The resistance value at the interface between the metal film 60 and the magnetic mold resin 40 is preferably equal to or larger than $10^6 \Omega$ over the entire area of the interface; however, it does not matter if the resistance value is partly smaller than $10^6 \Omega$.

Basically, the surface resistance value of the magnetic mold resin 40 substantially coincides with the volume resistivity of the magnetic mold resin 40. Thus, basically, when the volume resistivity of the magnetic mold resin 40 is equal to or larger than $10^{10}$ $\Omega$ cm, the surface resistance value of the magnetic mold resin 40 is also equal to or larger than $10^{10}\Omega$. However, as explained with reference to FIG. 5, the magnetic mold resin 40 undergoes dicing at manufacturing, so that the magnetic filler 6 may be exposed to a cut surface (i.e., side surface 42), and in this case, the surface resistance value of the side surface 42 becomes smaller than the volume resistivity. Similarly, when the top surface 41 of the magnetic mold resin 40 is ground for reducing height or roughing the surface, the magnetic filler 6 may be exposed to the top surface 41, and in this case, the surface resistance value of the top surface 41 becomes smaller than the volume resistivity. As a result, even when the volume resistivity of the magnetic mold resin 40 is equal to or larger than $10^{10}$ $\Omega$cm, the surface resistance value of the magnetic mold resin 40 may be smaller than $10^{10}\Omega$; however, in such a case, when the surface resistance value of the magnetic mold resin 40 is equal to or larger than $10^6\Omega$, it is possible to prevent inflow of the eddy current.

Figure 20:
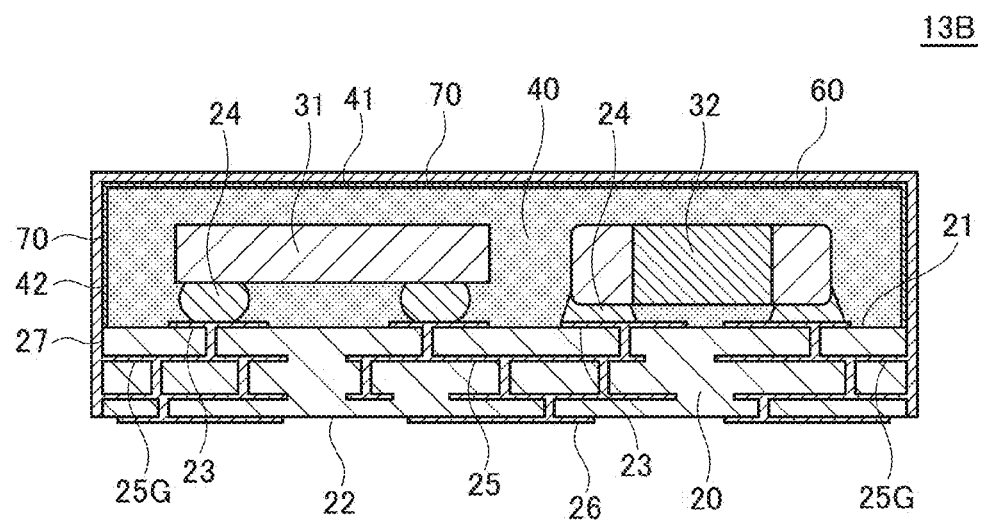
FIG. 20 is a cross-sectional view illustrating a configuration of an electronic circuit package according to a first modification of the third embodiment.

When the surface resistance value of the top surface 41 or side surface 42 of the magnetic mold resin 40 is reduced to smaller than $10^6\Omega$, a thin insulating material may be formed on the top surface 41 or side surface 42 of the magnetic mold resin 40. FIG. 20 is a cross-sectional view illustrating a configuration of an electronic circuit package 13B according to a first modification. The electronic circuit package 13B of FIG. 20 differs from the electronic circuit package 13A of FIG. 19 in that a thin insulating film 70 is interposed between the top surface 41 and side surfaces 42 of the magnetic mold resin 40 and the metal film 60. With this configuration, even when the surface resistance value of the top surface 41 or side surface 42 of the magnetic mold resin 40 is reduced to smaller than $10^6\Omega$, the resistance value at the interface between the metal film 60 and the magnetic mold resin 40 can be made equal to or larger than $10^6\Omega$, making it possible to prevent deterioration in the magnetic characteristics due to the eddy current.

Figure 21:
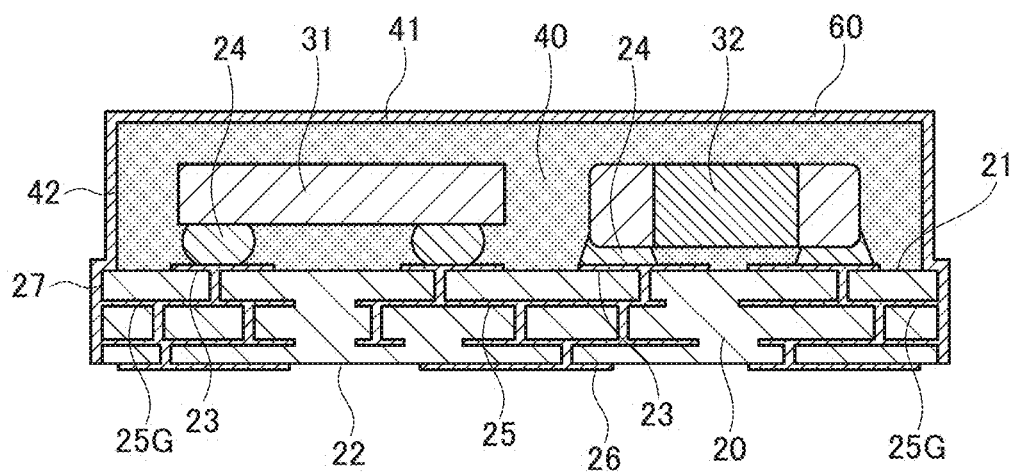
FIG. 21 is a cross-sectional view illustrating a configuration of an electronic circuit package according to a second modification of the third embodiment.

FIG. 21 is a cross-sectional view illustrating a configuration of an electronic circuit package 13C according to a second modification of the third embodiment.

As illustrated in FIG. 21, an electronic circuit package 13C according to the second modification differs from the electronic circuit package 13A illustrated in FIG. 19 in that a planar size of the magnetic mold resin 40 is slightly smaller than a planar size of the substrate 20 and, therefore, an outer peripheral portion of the front surface 21 of the substrate is exposed from the magnetic mold resin 40. Other configurations are the same as those of the electronic circuit package 13A. Thus, in FIG. 21, the same reference numerals are given to the same elements as in FIG. 19, and repetitive descriptions will be omitted.

As exemplified by the electronic circuit package 13C according to the second modification, it is not essential in the present invention that the side surface 42 of the magnetic mold resin 40 and the side surface 27 of the substrate 20 form the same plane, but the planar size of the magnetic mold resin 40 may be smaller than that of the substrate 20.

Figure 22:
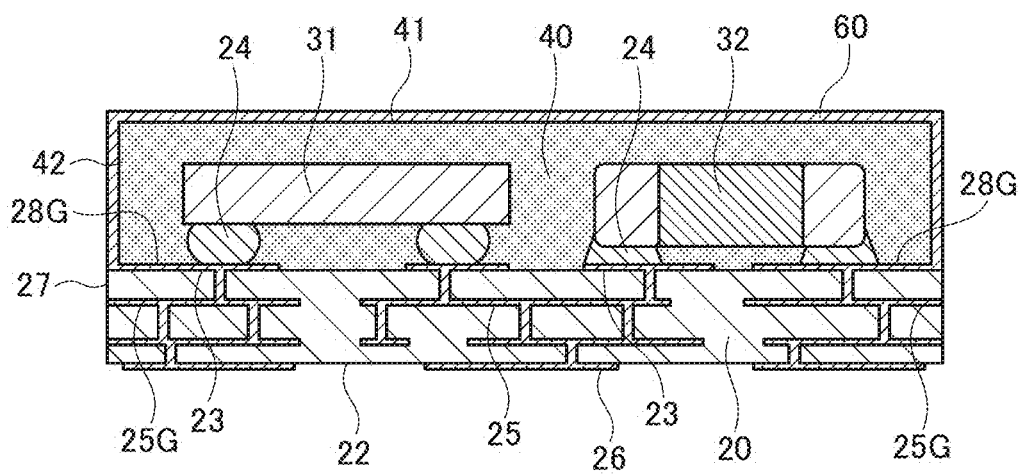
FIG. 22 is a cross-sectional view illustrating a configuration of an electronic circuit package according to a third modification of the third embodiment.

Further, as illustrated in FIG. 22 which illustrates an electronic circuit package 13D as the third modification of this embodiment, a structure in which the metal film 60 does not cover the side surface 27 of the substrate 20 may be employed. In this case, a power supply patterns 28G are provided at an outer peripheral portion of the surface 21 of the substrate 20 that is exposed from the magnetic mold resin 40 and contacts the metal film 60. As a result, a fixed potential such as a ground potential is applied to the metal film 60.

Figure 23:
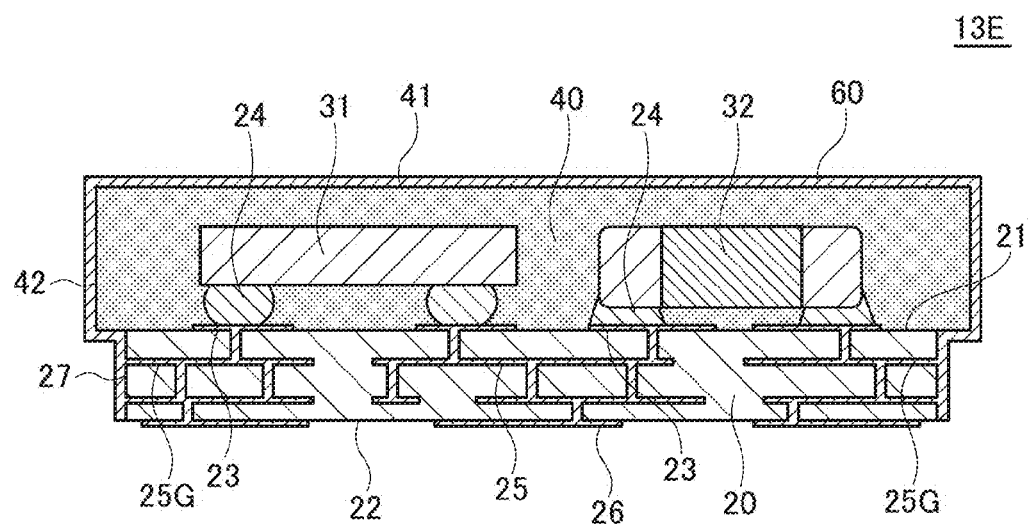
FIG. 23 is a cross-sectional view illustrating a configuration of an electronic circuit package according to a fourth modification of the third embodiment.

FIG. 23 is a cross-sectional view illustrating a configuration of an electronic circuit package 13E according to the fourth modification of the third embodiment.

As illustrated in FIG. 23, an electronic circuit package 13E according to the fourth modification differs from the electronic circuit package 13A illustrated in FIG. 19 in that the planar size of the magnetic mold resin 40 is slightly larger than the planar size of the substrate 20. Other configurations are the same as those of the electronic circuit package 13A. Thus, in FIG. 23, the same reference numerals are given to the same elements as in FIG. 19, and repetitive descriptions will be omitted.

As exemplified by the electronic circuit package 13E according to the fourth modification, in the present invention, the planar size of the magnetic mold resin 40 may be larger than that of the substrate 20.

As described above, the electronic circuit packages 13A to 13E according to the present embodiment use the magnetic mold resin 40 and have the surfaces covered with the metal film 60. With this configuration, it is possible to obtain a composite shielding structure. This can effectively shield electromagnetic wave noise radiated from the electronic components 31 and 32 and external electromagnetic wave noise entering the electronic components 31 and 32 while achieving reduction in height. In particular, the electronic circuit packages 13A to 13E according to the present embodiment can shield the electromagnetic wave noise radiated from the electronic components 31 and 32 more effectively. This is because the electromagnetic wave noise radiated from the electronic components 31 and 32 is partly absorbed when it passes through the magnetic mold resin 40, and the remaining electromagnetic wave noise that has not been absorbed is reflected by the metal film 60 and passes through the magnetic mold resin 40 once again. As described above, the magnetic mold resin 40 acts on the incident electromagnetic wave noise twice, thereby effectively shielding the electromagnetic wave noise radiated from the electronic components 31 and 32.

Further, when the volume resistivity of the magnetic mold resin 40 is equal to or more than $10^{10}$ Ω cm in the electronic circuit packages 13A to 13E according to the present embodiment, it is possible to ensure sufficient insulating performance required for the mold member. In addition, when the resistance value at the interface between the magnetic mold resin 40 and the metal film 60 is equal to or more than $10^6$Ω, it is possible to substantially prevent the eddy current generated when the electromagnetic wave noise enters the metal film 60 from flowing into the magnetic mold resin 40. As a result, it is possible to prevent deterioration in the magnetic characteristics of the magnetic mold resin 40 due to inflow of the eddy current.

Figure 24:
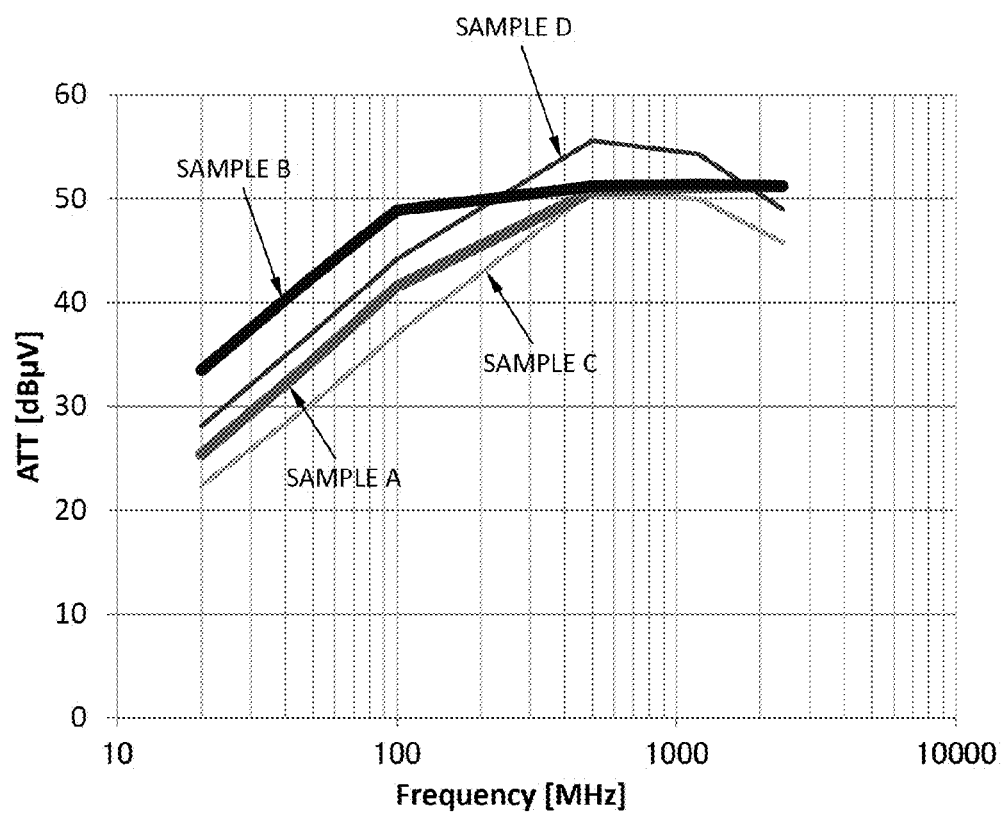
FIG. 24 is a graph illustrating noise attenuation in the electronic circuit package shown in FIG. 19.

FIG. 24 is a graph illustrating noise attenuation in the electronic circuit package 13A in the case where the substrate 20 has a thickness of 0.25 mm, and the magnetic mold resin 40 has a thickness of 0.50 mm. The metal film 60 is composed of a laminated film of Cu and Ni, and two types of metal films 60 whose Cu films have different thicknesses are evaluated. Specifically, the metal film 60 of sample A has a configuration in which the Cu film having a thickness of 4 µm and the Ni film having a thickness of 2 µm are laminated, and the metal film 60 of sample B has a configuration in which the Cu film having a thickness of 7 µm and the Ni film having a thickness of 2 µm are laminated. For comparison, values of samples C and D each formed by using a molding material not containing the magnetic filler 6 are also shown. The metal film 60 of sample C has a configuration in which the Cu film having a thickness of 4 µm and the Ni film having a thickness of 2 µm are laminated, and the metal film 60 of sample D has a configuration in which the Cu film having a thickness of 7 µm and the Ni film having a thickness of 2 µm are laminated.

As illustrated in FIG. 24, when the composite magnetic sealing material 2 containing the magnetic filler 6 is used, noise attenuation effect is enhanced especially at a frequency band of 100 MHz or less as compared to a case where the molding material not containing the magnetic filler 6 is used. Further, it can be seen that the larger the thickness of the metal film 60, the higher the noise attenuation performance.

Figure 25:
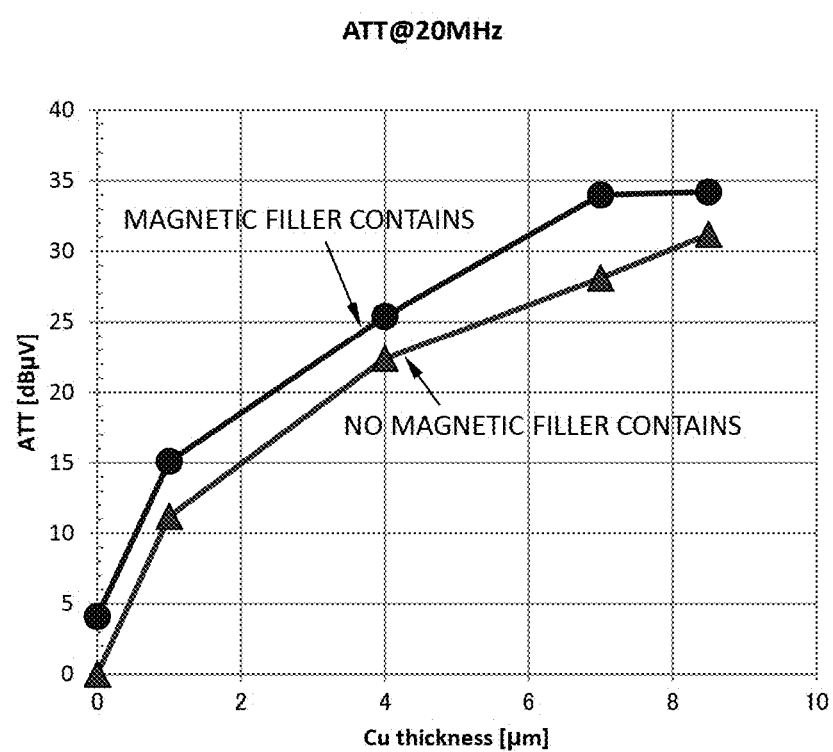
FIGS. 25 to 27 are graphs each illustrating the relationship between the film thickness of the metal film included in the electronic circuit package shown in FIG. 19 and noise attenuation.
Figure 26:
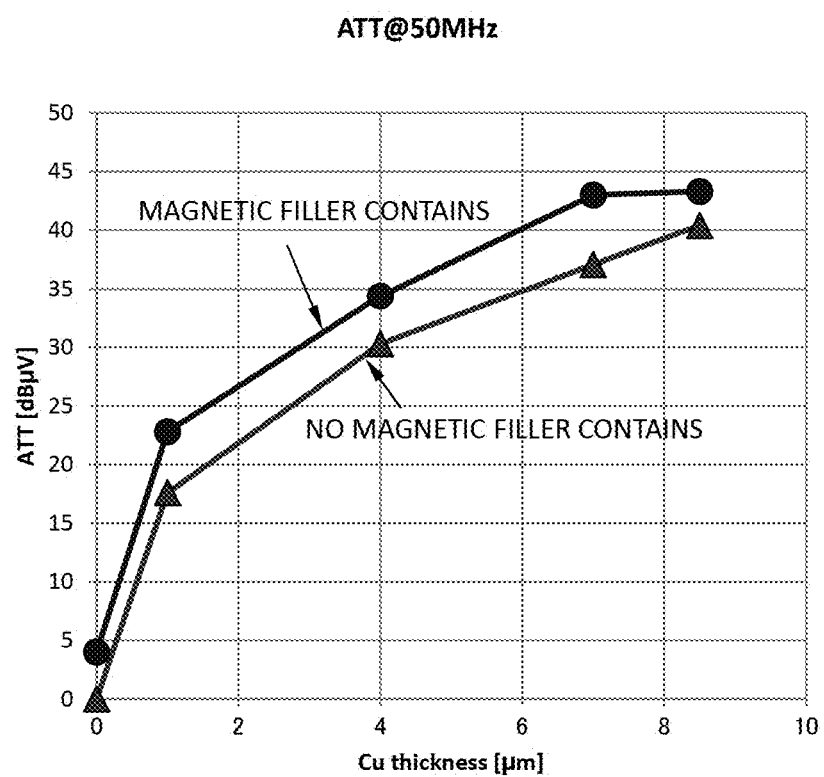
Figure 27:
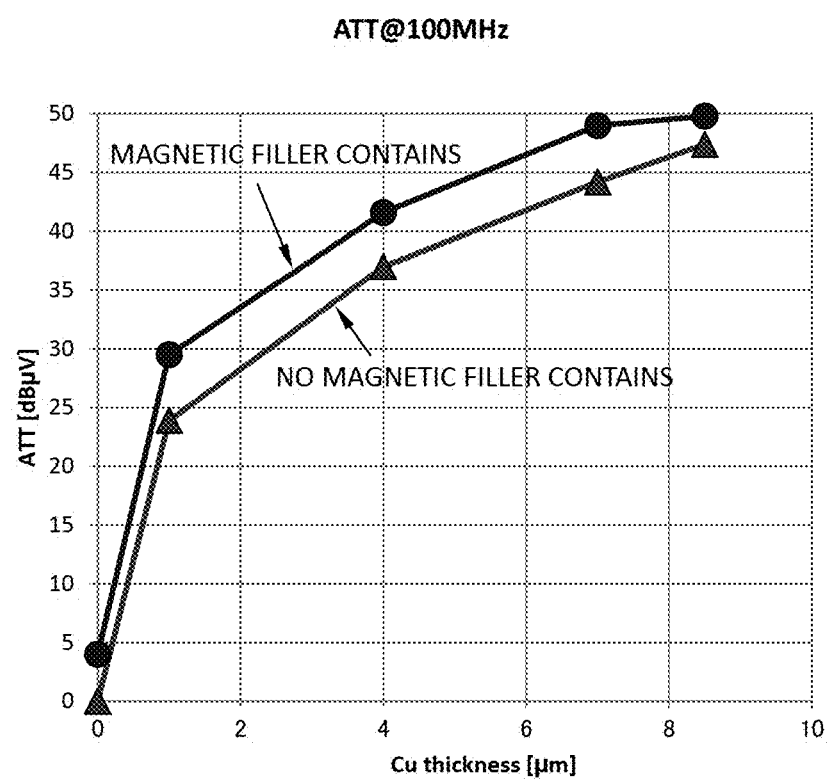

FIGS. 25 to 27 are graphs each illustrating the relationship between the film thickness of the metal film 60 included in the electronic circuit package 13A and noise attenuation. FIG. 25, FIG. 26, and FIG. 27 illustrate the noise attenuation in the frequency bands of 20 MHz, 50 MHz, and 100 MHz, respectively. For comparison, a value obtained when a molding material not containing the magnetic filler 6 is also shown.

As illustrated, in all the frequency bands of FIGS. 25 to 27, the larger the thickness of the metal film 60, the higher the noise attenuation performance. Further, by using the composite magnetic sealing material 2 containing the magnetic filler 6, it is possible to obtain higher noise attenuation performance in all the frequency bands of FIGS. 25 to 27, than in a case where a molding material not containing the magnetic filler 6.

Figure 28:
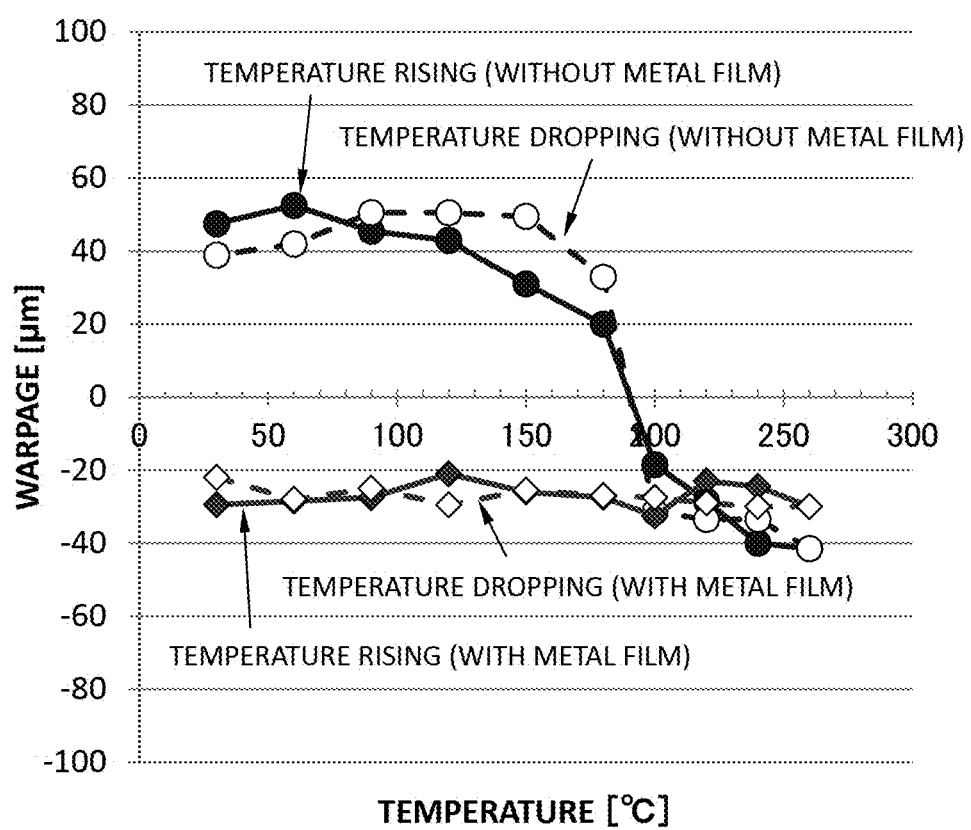
FIGS. 28 and 29 are graphs illustrating the warp amount of the substrate during temperature rising and that during temperature dropping in the electronic circuit packages shown in FIGS. 1 and 19.
Figure 29:
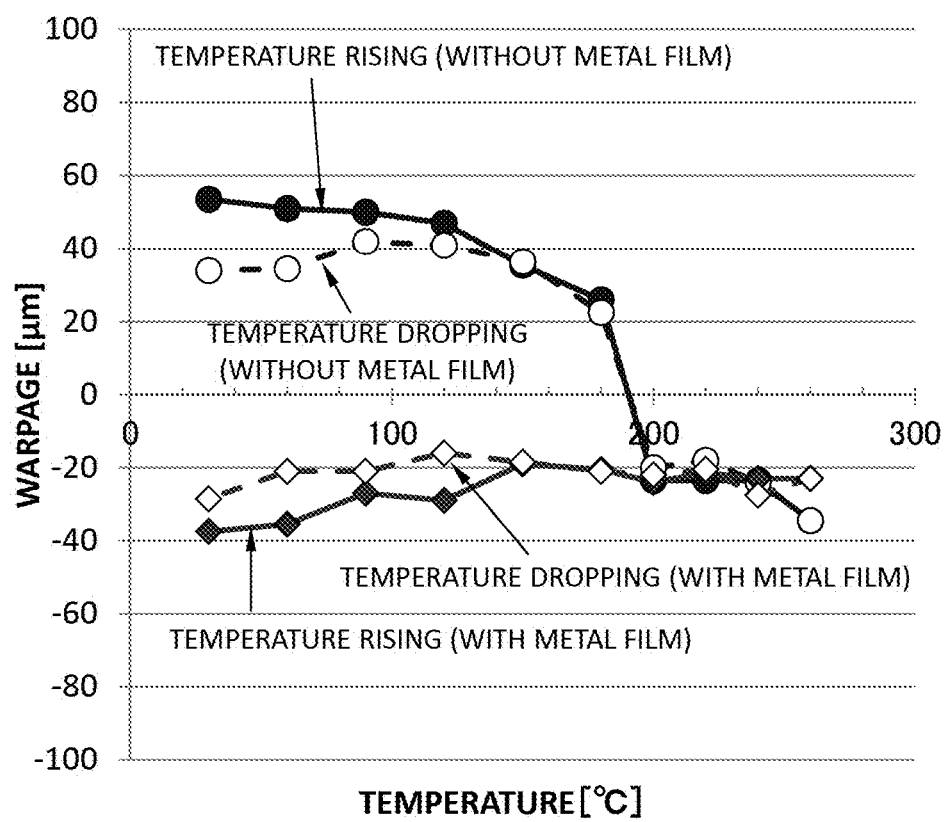

FIG. 28 is a graph illustrating the warp amount of the substrate 20 during temperature rising and that during temperature dropping in the electronic circuit packages 11A (without metal film) and the electronic circuit packages 13A (with metal film). For comparison, values obtained when the magnetic filler 6 is substituted by the non-magnetic filler formed of $SiO_2$ are shown in FIG. 29.

As illustrated in FIG. 28, the warp amount of the substrate 20 caused due to a temperature change is smaller in the electronic circuit package 13A having the metal film 60 than in the electronic circuit package 11A not having the metal film 60. Further, as is clear from a comparison between FIGS. 28 and 29, the warp characteristics of the respective electronic circuit packages 11A and 13A using the composite magnetic sealing material 2 containing the magnetic filler 6 are substantially equivalent to the warp characteristics of the respective electronic circuit packages 11A and 13A using a molding material containing the non-magnetic filler formed of $SiO_2$.

<Fourth Embodiment>

Figure 30:
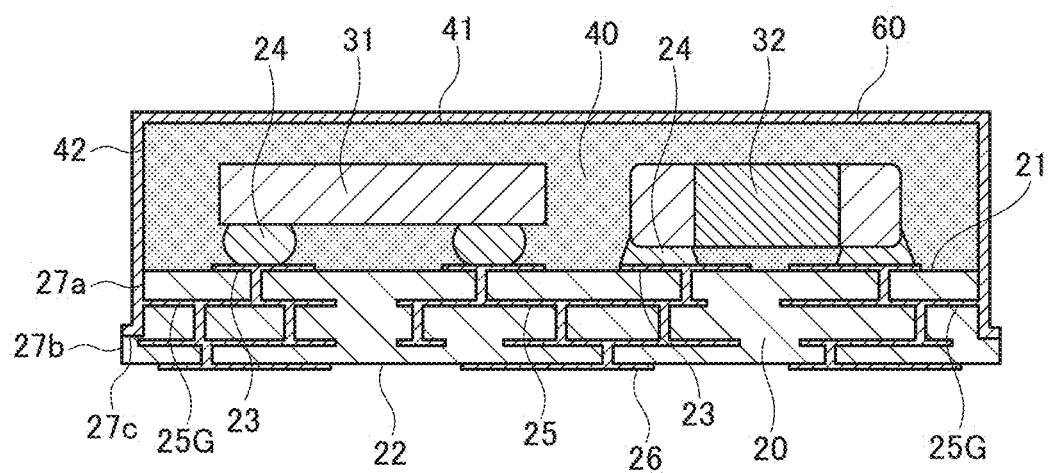
FIG. 30 is a cross-sectional view illustrating a configuration of an electronic circuit package according to a fourth embodiment of the present invention.

FIG. 30 is a cross-sectional view illustrating a configuration of an electronic circuit package 14A according to the fourth embodiment of the present invention.

As illustrated in FIG. 30, an electronic circuit package 14A according to the present embodiment is the same as the electronic circuit package 13A according to the third embodiment illustrated in FIG. 19 except for shapes of the substrate 20 and metal film 60. Thus, in FIG. 30, the same reference numerals are given to the same elements as in FIG. 19, and repetitive descriptions will be omitted.

In the present embodiment, the side surface 27 of the substrate 20 is formed stepwise. Specifically, a side surface lower portion 27b protrudes from a side surface upper portion 27a. The metal film 60 is not formed over the entire side surface of the substrate 20 but formed so as to cover the side surface upper portion 27a and a step portion 27c. That is, the side surface lower portion 27b is not covered with the metal film 60. Also in the present embodiment, the power supply patterns 25G are exposed from the side surface upper portion 27a of the substrate 20, so that the metal film 60 is connected to the power supply patterns 25G at the exposed portion.

Figure 31:
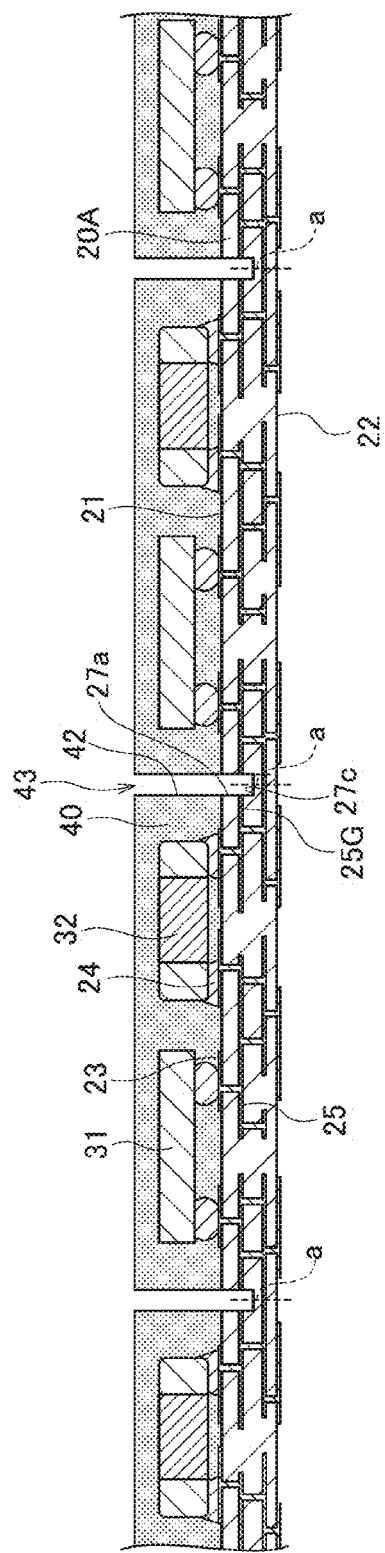
FIGS. 31 to 32 are process views for explaining a manufacturing method for the electronic circuit package shown in FIG. 30.
Figure 32:
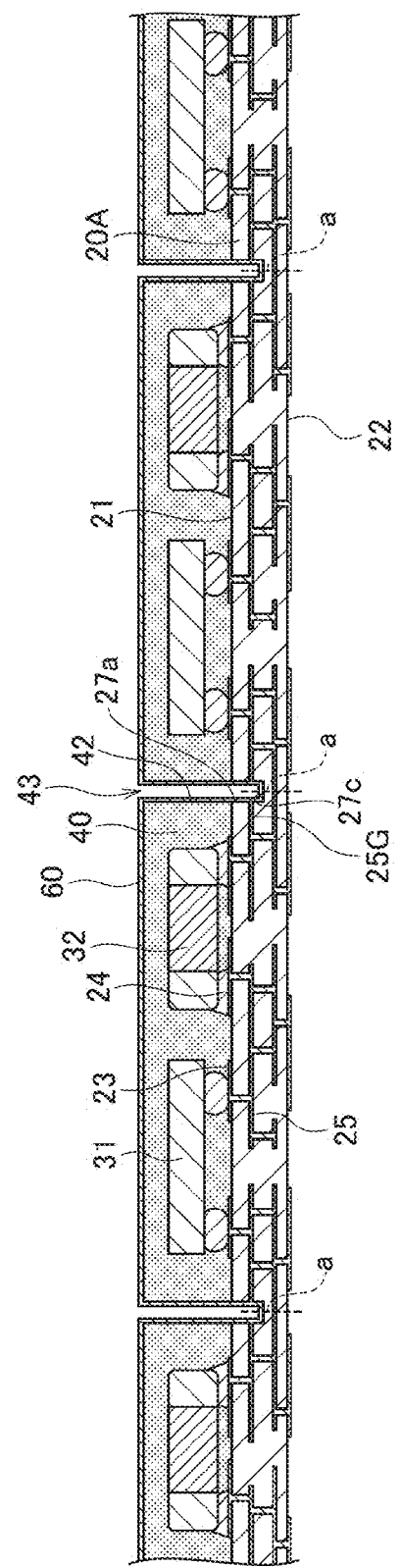

FIGS. 31 and 32 are process views for explaining a manufacturing method for the electronic circuit package 14A.

First, the magnetic mold resin 40 is formed on the front surface 21 of the assembly substrate 20A by using the method described in FIGS. 3 and 4. Then, as illustrated in FIG. 31, a groove 43 is formed along the dashed line a denoting the dicing position. In the present embodiment, the power supply patterns 25G pass the dashed line a as a dicing position. Thus, when the assembly substrate 20A is cut along the dashed line a, the power supply patterns 25G are exposed from the side surface 27 of the substrate 20. The groove 43 is formed so as to completely cut the magnetic mold resin 40 and so as not to completely cut the assembly substrate 20A. As a result, the side surface 42 of the magnetic mold resin 40 and side surface upper portion 27a and step portion 27c of the substrate 20 are exposed inside the groove 43. A depth of the groove 43 is set so as to allow at least the power supply patterns 25G to be exposed from the side surface upper portion 27a.

Then, as illustrated in FIG. 32, the metal film 60 is formed by using a sputtering method, a vapor-deposition method, an electroless plating method, an electrolytic plating method, or the like. As a result, the top surface 41 of the magnetic mold resin 40 and inside of the groove 43 are covered with the metal film 60. At this time, the power supply patterns 25G exposed to the side surface upper portion 27a of the substrate 20 are connected to the metal film 60.

Then, the assembly substrate 20A is cut along the dashed line a to divide the assembly substrate 20A into individual substrates 20, whereby the electronic circuit package 14A according to the present embodiment is completed.

As described above, according to the manufacturing method for the electronic circuit package 14A of the present embodiment, formation of the groove 43 allows the metal film 60 to be formed before dividing the assembly substrate 20A into individual substrates 20, thereby forming the metal film 60 easily and reliably.

While the preferred embodiments of the present invention have been described, the present invention is not limited thereto. Thus, various modifications may be made without departing from the gist of the invention, and all of the modifications thereof are included in the scope of the present invention.

EXAMPLES

<Production of Composite Magnetic Sealing Material>

A resin material was prepared with 830S (bisphenol A epoxy resin) made by Dainippon Ink & Chemicals, Inc., used as a base resin, with 0.5 equivalent of DicyDD (Digi Angi amide) made by Nippon Carbide Industries Co., Inc. added to the base resin as a curing agent, and with 1 wt. % of C11Z-CN (imidazole) made by Shikoku Chemicals Corporation added to the base resin as a curing accelerator.

50 vol. %, 60 vol. %, or 70 vol. % of a magnetic filler having the composition illustrated in FIG. 33 was added to the above resin material, followed by intensive kneading to obtain a paste. If pasting failed, butylcarbitol acetate was added appropriately. The obtained paste was coated to a thickness of about 300 μm and then heat-cured sequentially at 100° C. for one hour, at 130° C. for one hour, at 150° C. for one hour, and at 180° C. for one hour in this order, to obtain a cured sheet. The composition 1 (comparative example) is a magnetic material generally called PB Permalloy.

<Measurement of Thermal Expansion Coefficient>

The above cured sheet was cut to a length of 12 mm and a width of 5 mm. Then, TMA was used to raise temperature from room temperature to 200° C. at 5° C./min, and a thermal expansion coefficient was calculated from the amount of expansion in a temperature range of 50° C. to 100° C. which is lower than a glass transition temperature. The measurement results are shown in FIG. 34. In FIG. 34, the measurement result obtained when the non-magnetic filler formed of $SiO_2$ is used in place of the magnetic filler is also shown.

As illustrated in FIG. 34, when the magnetic filler having the composition 2 or 3 is used, the thermal expansion coefficient is significantly reduced as compared to when the magnetic filler having the composition 1 (comparative example) is used. In particular, when the additive amount is 60 vol. % or more, a thermal expansion coefficient equivalent to that obtained when the non-magnetic filler formed of $SiO_2$ is used is obtained, and when the additive amount is 70 vol. %, the thermal expansion coefficient is as small as 10 ppm/° C. or less.

<Measurement of Magnetic Permeability>

The above cured sheet was cut into a ring shape having an outer diameter of 7.9 mm and an inner diameter of 3.1 mm. Then, the material analyzer function of impedance analyzer E4991 manufactured by Agilent Corp., Ltd. was used to measure an effective magnetic permeability ($\mu'$) at 10 MHz. The measurement results are shown in FIG. 35.

As illustrated in FIG. 35, the magnetic permeability obtained when the magnetic filler having the composition 2 or 3 is substantially equivalent to the magnetic permeability obtained when the magnetic filler having the composition 1 (Comparative Example) is used.

<Considerations>

The composite magnetic sealing material obtained by adding the magnetic filler having the composition 2 or 3 to a resin material has a thermal expansion coefficient equivalent to the thermal expansion coefficient obtained when the non-magnetic filler formed of $SiO_2$ is used and has a magnetic permeability equivalent to the magnetic permeability obtained when the magnetic filler formed of PB permalloy is used. Thus, by using, as a sealing material for an electronic circuit package, the composite magnetic sealing material obtained by adding the magnetic filler having the composition 2 or 3 to a resin material, it is possible to obtain excellent magnetic shielding characteristics while preventing the warp of the substrate, interfacial delamination or crack of a molding material.

What is claimed is:

1. An electronic circuit package comprising:
    a substrate;
    an electronic component mounted on a surface of the substrate; and
    a magnetic mold resin covering the surface of the substrate so as to embed therein the electronic component,
    wherein the magnetic mold resin includes:
        a resin material; and
        a filler blended in the resin material in a blended ratio of 30 vol. % or more to 85 vol. % or less, and
    wherein the filler includes a magnetic filler containing Fe and 32 wt. % or more and 39 wt. % or less of a metal material composed mainly of Ni, thereby a thermal expansion coefficient of the magnetic mold resin is 15 ppm/° C. or less.

2. The electronic circuit package as claimed in claim 1, wherein the filler further includes a non-magnetic filler.

3. The electronic circuit package as claimed in claim 2, wherein a ratio of an amount of the non-magnetic filler relative to a sum of an amounts of the magnetic filler and the non-magnetic filler is 1vol. % or more and 40 vol. % or less.

4. The electronic circuit package as claimed in claim 3, wherein the non-magnetic filler contains at least one material selected from a group consisting of SiO2, ZrW2O8, (ZrO)2P2O7, KZr2(PO4)3, or Zr2(WO4)(PO4)2.

5. The electronic circuit package as claimed in claim 1, wherein the magnetic filler is coated with an insulating material.

6. The electronic circuit package as claimed in claim 5, wherein a film thickness of the insulating material is 10 nm or more.

7. The electronic circuit package as claimed in claim 1, wherein the resin material comprises a thermosetting resin material.

8. The electronic circuit package as claimed in claim 7, wherein the thermosetting resin material contains at least one material selected from a group consisting of an epoxy resin, a phenol resin, a urethane resin, a silicone resin, or an imide resin.

9. The electronic circuit package as claimed in claim 1, further comprising a metal film covering the magnetic mold resin,
wherein the metal film is connected to a power supply pattern provided in the substrate.

10. The electronic circuit package as claimed in claim 9, wherein the metal film is mainly composed of at least one metal selected from a group consisting of Au, Ag, Cu, and Al.

11. The electronic circuit package as claimed in claim 9, wherein a surface of the metal film is covered with an antioxidant film.

12. The electronic circuit package as claimed in claim 9, wherein the power supply pattern is exposed to a side surface of the substrate, and the metal film contacts the power supply pattern exposed on the side surface of the substrate.

13. The electronic circuit package as claimed in claim 1, wherein the metal material further contains 0.1 wt. % or more and 8 wt. % or less of Co relative to a total weight of the magnetic filler.

14. The electronic circuit package as claimed in claim 1, wherein the magnetic filler has a substantially spherical shape.

15. The electronic circuit package as claimed in claim 1, wherein a volume resistivity of the magnetic mold resin is $10^{10}$ W cm or more.

16. The electronic circuit package as claimed in claim 1, further comprising a non-magnetic member provided between the electronic component and the magnetic mold resin.

17. An electronic circuit package comprising:
a substrate;
an electronic component mounted on a surface of the substrate; and
a magnetic mold resin covering the surface of the substrate so as to embed therein the electronic component,
wherein the magnetic mold resin includes:
 a resin material;
 a magnetic filler formed of an Fe-Ni based material blended in the resin material, the magnetic filler containing Fe and 32 wt. % or more and 39 wt. % or less of a metal material composed mainly of Ni, and
 a non-magnetic filler blended in the resin material,
wherein a ratio of an amount of the non-magnetic filler relative to a sum of an amounts of the magnetic filler and the non-magnetic filler is 1 vol. % or more and 40 vol. % or less, and
wherein a thermal expansion coefficient of the magnetic mold resin is 15 ppm/° C. or less.

18. An electronic circuit package comprising:
a substrate;
an electronic component mounted on a surface of the substrate; and
a magnetic mold resin covering the surface of the substrate so as to embed therein the electronic component,
wherein the magnetic mold resin includes:
 a resin material;
 a magnetic filler containing Fe and 32wt. % or more and 39wt. % or less of a metal material composed mainly of Ni blended in the resin material; and
 a non-magnetic filler blended in the resin material,
wherein a blended ratio of the magnetic filler in the resin material is 30vol. % or more to 85vol. % or less, and
wherein a blended ratio of the magnetic filler and the non-magnetic filler in the resin material is 50vol. % or more and 85vol. % or less.

19. The electronic circuit package as claimed in claim 18, wherein the metal material further contains 0.1wt. % or more and 8wt.% or less of Co relative to a total weight of the magnetic filler.

* * * * *